US006809539B2

(12) United States Patent
Wada et al.

(10) Patent No.: US 6,809,539 B2
(45) Date of Patent: Oct. 26, 2004

(54) PROBE CARD FOR TESTING AN INTEGRATED CIRCUIT

(75) Inventors: Kouichi Wada, Tokyo (JP); Takehisa Takoshima, Tokyo (JP); Akira Shimokohbe, Tokyo (JP); Seiichi Hata, Tokyo (JP)

(73) Assignee: Advantest Corporation, Tokyo (JP)

( * ) Notice: Subject to any disclaimer, the term of this patent is extended or adjusted under 35 U.S.C. 154(b) by 28 days.

(21) Appl. No.: 10/031,823

(22) PCT Filed: May 17, 2001

(86) PCT No.: PCT/JP01/04135

§ 371 (c)(1),
(2), (4) Date: Jun. 13, 2002

(87) PCT Pub. No.: WO01/88551

PCT Pub. Date: Nov. 22, 2001

(65) Prior Publication Data

US 2002/0163349 A1 Nov. 7, 2002

(30) Foreign Application Priority Data

May 18, 2000 (JP) ........................................ 2000-145975

(51) Int. Cl.[7] ............................................. G01R 31/02
(52) U.S. Cl. ........................ 324/762; 324/754; 324/761
(58) Field of Search ........................ 324/72.5, 754–762; 174/260, 267; 439/169, 174, 482, 912; 216/2, 11, 23

(56) References Cited

U.S. PATENT DOCUMENTS

| | | | | |
|---|---|---|---|---|
| 4,965,865 A | * | 10/1990 | Trenary | 324/754 |
| 5,166,774 A | * | 11/1992 | Banerji et al. | 361/749 |
| 5,324,368 A | * | 6/1994 | Masumoto et al. | 148/561 |
| 5,613,861 A | | 3/1997 | Smith et al. | 439/81 |
| 6,028,436 A | * | 2/2000 | Akram et al. | 324/755 |
| 6,114,864 A | | 9/2000 | Soejima et al. | 324/754 |
| 6,245,444 B1 | * | 6/2001 | Marcus et al. | 428/616 |
| 6,399,900 B1 | * | 6/2002 | Khoury et al. | 174/267 |

FOREIGN PATENT DOCUMENTS

| | | | |
|---|---|---|---|
| JP | 1-128381 A | 5/1989 | |
| JP | 1-150862 | 6/1989 | ........... G01R/1/073 |
| JP | 5-251523 A | 9/1993 | |
| JP | 5-309427 A | 11/1993 | |
| JP | 6-308158 A1 | 11/1994 | |
| JP | 9-126833 A | 5/1997 | |
| JP | 9-196970 A | 7/1997 | |
| JP | 9-281144 | 10/1997 | ........... G01R/1/073 |
| JP | 10-197560 | 7/1998 | ........... G01R/1/073 |
| JP | 11-133062 | 5/1999 | ........... G01R/1/073 |
| JP | 11-160355 A | 6/1999 | |
| JP | 2000-65852 A | 3/2000 | |
| JP | 2000-74941 A | 3/2000 | |
| JP | 2000-317900 A | 11/2000 | |

OTHER PUBLICATIONS

Donald L. Smith et al., "Flip–Chip on 6–um Pitch using Thin–Film Microspring Technology," Proceedings of the 48th Electronic Components and Technology Conference; Seattle, Washington; May 1998; copyright 1998 IEEE; 3 pages.

(List continued on next page.)

*Primary Examiner*—Minh N. Tang
(74) *Attorney, Agent, or Firm*—Osha & May L.L.P.

(57) ABSTRACT

A probe card transmits high frequency signals between an integrated circuit under test and a semiconductor-testing device. The probe card includes a substrate, a signal transmission path formed on the substrate, a contactor formed on an end portion of the signal transmission path on one side of the substrate, a grounding conductor grounded, and a hole. The contactor is made of a metallic glass material, which shows a nature of viscous fluidity in the supercooled liquid region. The contactor is separated from the substrate over the hole. The contactor elastically contacts a pad of the circuit under test.

8 Claims, 27 Drawing Sheets

OTHER PUBLICATIONS

Soonil Hong et al., "Design and Fabrication of a Monolithic High–Density Probe Card for High–Frequency On–Water Testing," IEDM 89, pp. 289–292 (4 pages), (no month).

Yanwei Zhang et al.; "A New Mems Wafer Probe Card," 0–7803–3744–1/97 IEEE, pp. 395–399 (5 pages), (no month).

Shinichiro Asai et al.; "Probe Card with Probe Pins Grown by the Vapor–Liquid–Solid(VLS) Method;" IEEE Transactions on Components, Packaging and Manufacturing Techbnology–Part A, vol. 19, No. 2, Jun. 1996; pp. 258–267 (10 pages).

Seiichi Hata, et al.,; "Hakamaky Kinzoku Glass wo mochiita Bisai Kouzoubutsu no Seisaku (Dai I Hou)"; Seimitsu Kougakkaishi, Jan. 2000, vol. 66, No. 1, pp. 96–101.

Document Bibilography and Abstract, Patent No.: JP1150862, Publication Date: Jun. 13, 1989, 1 page.

Patent Abstracts of Japan, Application No. 09005352, Publication Date Jul. 31, 1998, 2 pages.

Patent Abstracts of Japan, Application No. 09295361, Publication Date: May 21, 1999, 2 pages.

Japanese Office Action date May 14, 2002 with partial translation of the same, 5 pages.

* cited by examiner-

FIG. 28(E')

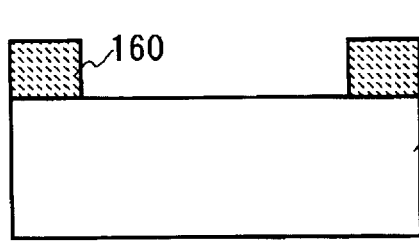
FIG. 29 (A)
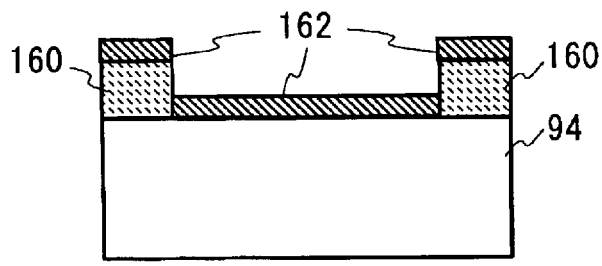
FIG. 29 (B)
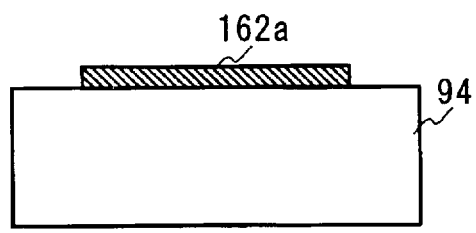
FIG. 29 (C)
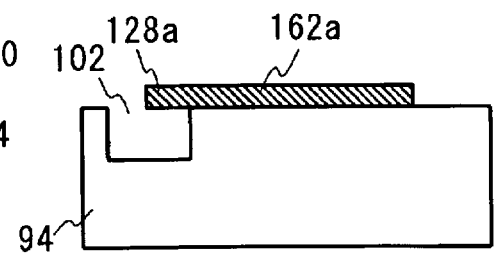
FIG. 29 (D)
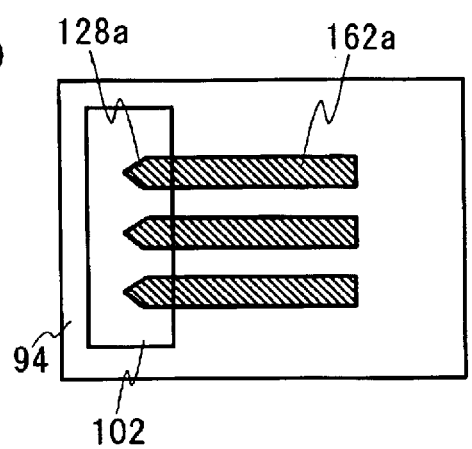
FIG. 29 (D')
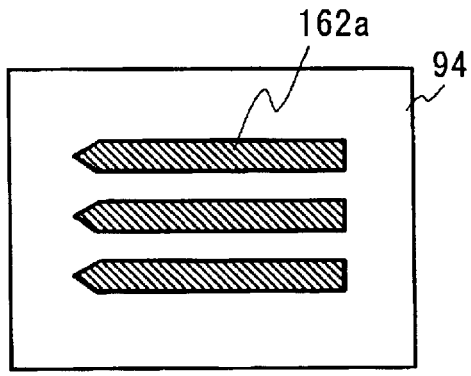
FIG. 29 (C')

FIG. 30(B')

PROBE CARD FOR TESTING AN INTEGRATED CIRCUIT

This patent application claims priority based on a Japanese patent application, 2000-145975 filed on May 18, 2000, the contents of which are incorporated herein by reference.

BACKGROUND OF THE INVENTION

1. Field of the Invention

The present invention relates to a probe card allowing signals to be transmitted between an integrated circuit and semiconductor testing equipment, especially to a probe card which can transmit high frequency signals to an integrated circuit having a plurality of pads on a narrow pitch area.

2. Description of the Related Art

When an integrated circuit is manufactured, testing the electric characteristic of the integrated circuit must be performed during manufacture. In order to perform this test, the installation of a transmission path for a test signal to be transmitted between a wafer where the integrated circuit is manufactured and semiconductor testing equipment is required. The transmission path may include a contactor on its front-end portion, and the test signal generated by the semiconductor testing equipment is provided to the integrated circuit by contacting the contactor to a contact terminal of the integrated circuit. Recently, as semiconductor devices operating at high frequency have been rapidly developed, the semiconductor testing equipment, the contactor and the transmission path between the semiconductor testing equipment and the contactor have been required to be ready for high frequency operation. Moreover, as density degree (or degree of integration) of recent semiconductor devices has increased remarkably, it has been required to develop a transmission path through which test signals can be provided to an integrated circuit having a plurality of pads on a narrow pitch area.

FIG. 1 shows a schematic diagram of a conventional contacting unit 10 through which a high frequency test signal can be transmitted between semiconductor testing equipment and a circuit under test, which is being tested. The contacting unit 10 includes a contactor 12, a coaxial cable 14 and a support-and-fixing unit 16. The contactor 12 clings to a front-end portion of the coaxial cable 14, and, during a test, is contacted to a contact terminal (for example, a pad, a soldering ball, a gold bump) of the circuit under test. The coaxial cable 14 is connected to the external semiconductor testing equipment (not shown). The support-and-fixing unit 16 supports the coaxial cable 14 and fixes the position of the contactor 12.

The transmission of signals between the external semiconductor testing equipment and the circuit under test is performed through the coaxial cable 14. Therefore, when a high frequency signal is transmitted by using the contacting unit 10, attenuation of the transmitted signal can be greatly reduced.

FIG. 2 shows a diagram of a portion of the contacting unit 10 near the contactor 12 in the direction of arrow A of FIG. 1. As shown in FIG. 2, the coaxial cable 14 has a signal line 18a for transmitting signals and a grounding line 18b for grounding. The contactor 12 includes a contactor 12a connected to a signal line of the circuit under test and contactors 12b and 12c connected to a grounding unit of the circuit under test. The contactors 12a, 12b and 12c are formed to be "air-coplanar" and maintain an impedance matching state almost until its front-end.

FIG. 3 shows the contactor 12 contacted to the circuit under test. The contactor 12a is contacted to the signal line 20a of the circuit under test, and contactors 12b and 12c are contacted to the grounding unit 20b and 20c of the circuit under test. The contacting unit 10 having the coaxial cable 14 can transmit high frequency signals of more than 100 GHz. Recent development of the integrated circuit is intended not only to increase speed operation but also to increase minuteness and increase integration of the circuit. According to the contacting unit 10 shown in FIG. 1, since the pitch of the contactor 12 is limited by the diameter of the coaxial cable 14, it is impossible to perform a test on a highly integrated circuit having pads of narrow pitches. Further, as the integration degree of the circuit is increased, since the number of pads formed on the circuit is more than several thousand, it is unreasonable in the cost aspect to form the contacting unit 10 shown in FIG. 1 as many as the number of the pads. Further, operating frequency of the next generation integrated circuit is in the range of 1 to several Giga-Hertz (GHz) and the contacting unit 10 is able to transmit high frequency signals of more than 100 GHz frequency band, but at present, it is not required to transmit such high frequency signals of more than 100 GHz frequency band.

Besides the contacting unit 10 shown in FIG. 1, a probe card having a plurality of contactors on a narrow pitch area is conventionally used for testing a circuit having a plurality of pads on a narrow pitch area. This probe card is required to be faster and have more pins on a narrower pitch. Further, the probe card is also required to have fine positioning ability and scrub function to perform sliding operation against pads of the circuit under test, to be light in weight for preventing deformation of the probe card and the wafer due to the weight, and to have area-array adaptability to a circuit of full-face terminal type. Further, in order to prevent waveform distortion during a test, a characteristic impedance from the input/output terminal of the semiconductor testing equipment and the contact terminal (pad) of the circuit under test must be maintained to be a predetermined value. Hereinafter, four (4) kinds of conventional probe pins used for the probe card are described in detail, and weak points of them are also described.

FIG. 4 shows conventional probe pins of a horizontal needle probe type. According to the horizontal needle probe type, a needle of diameter 200~300 um is used, wherein the needle is made of a metal like W, ReW, BeCu or Pd and has a tapered end. According to the conventional type, since the end of the needle is as long as 20 mm, the characteristic impedance is changed on the end area and reflection noise is generated. Therefore, measurable maximum frequency is as low as 0.2 GHz. Further, since this type of probe pin is made by hand, it is difficult to accomplish area-array adaptability, high density, low weight and fine positioning ability. Moreover, since the needle made of W, ReW, BeCu or Pd has crystalline grains, scrapes generated through scrubbing with the pad enter into the crystalline grains of the needle made of this kind of material after repeated contact with the pad of the circuit under test, and, as a result, contact resistance is increased.

FIG. 5 shows another conventional probe pin of a vertical needle probe type. The vertical needle probe type is developed to achieve the area-array adaptability and high density, which were problematic of the horizontal needle probe type, but the achievement level is still unsatisfactory. Further, compared with the horizontal type, the vertical needle probe type is at least 1.5 times heavier in weight, and it is impossible to achieve the goal of being light weight. According to the structure of the vertical type, since it is difficult to perform sliding operation, it is impossible to achieve satisfactory scrub function.

FIG. 6 shows conventional probe pins made by the membrane method. The membrane method is developed to accomplish goals of high speed, high density and area-array adaptability. According to the membrane method, metal bumps as probe pins are formed on the wiring substrate of polyimide film. The height of a metal bump is as low as dozens of micrometers (um), and it is possible to form a transmission path just in front of the metal bump, so that it is possible to achieve high speed operation. According to this method, however, since load is applied in the vertical direction, it is difficult to achieve a powerful scrub function. Further, since polyimide film is used as the substrate, the polyimide film is not uniformly expanded when a high temperature test is performed on the LSI, so that position alignment between the pads of the circuit under test and the metal bumps is not maintained.

FIG. 7 shows conventional probe pins made through photolithography plating. According to photolithography plating, it is possible to achieve the goals of high precision, high density and having many pins. Further, since it is possible to form a transmission line to the base of a probe pin, it is possible to achieve high speed operation. According to the structure, however, it is difficult to achieve area-array adaptability.

According to a U.S. Pat. No. 5,613,861, there is disclosed a method for manufacturing a probe by using an internal stress gradient of a thin film. MoCr is used as a material for this probe. However, this method has poor reproducibility because it uses internal stress, and it is difficult to form probes in the same shape.

According to Donald L. Smith, et. Al., in their "Flip-Chip Bonding on 6-um Pitch using Thin-Film Microspring Technology" ((Proceedings of 48th Electronic Components and Technology Conf.; Seattle, Wash. (May, 1998):c1998 IEEE), there is disclosed a method for forming a MoCr thin film having an internal stress gradient in the direction of thickness using a step-by-step increase of pressure while depositing the thin film. According to this method, since the reproducibility of controlling the stress is poor, it is difficult to form probes in the same shape.

According to Soonil Hong, et. Al., in their "DESIGN AND FABRICATION OF A MONOLITHIC HIGH-DENSITY PROBE CARD FOR HIGH-FREQUENCY ON-WATER TESTING" (IEDM 89, pp. 289–292), there is disclosed a method for manufacturing a probe by accumulating thin films of which stress are different. According to this method, since a plurality of thin films are formed, it is difficult to achieve uniform characteristics between probes and to manufacture probes of the same characteristic.

According to Yanwei Zhang, et. Al., in their "A NEW MEMS WAFER PROBE CARD" (0-7803-3744-1/97 IEEE, pp. 395–399), there is disclosed a method for manufacturing a probe using bimorphs. Since this method uses a heater, the structure is complex due to the wirings for the heater.

According to Shinichiro Asai, et. Al., in their "Probe Card with Probe Pins Grown by the Vapor-Liquid-Solid (VLS) Method" (IEEE TRANSACTIONS ON COMPONENTS, PACKAGING AND MANUFACTURING TECHNOLOGY-PART A, VOL. 19, NO. 2, JUNE 1996), there is disclosed a "whisker-probe" which is grown vertically from the substrate. Since this probe is as long as 1~3 mm, it is difficult to achieve high speed operation and light weight.

As described before with reference to FIGS. 4 to 7 and other references, the conventional probe pins are not able to achieve the above characteristics which are the described goals. Therefore, it is required to develop a probe card which can achieve the goals of high speed operation, high density, many pins, area-array adaptability, scrub function, light weight and fine positioning.

Therefore, the present invention has a goal of providing a probe card which can transmit a high-frequency signal of more than 1 GHz frequency.

It is an object of the present invention to provide a probe card which can achieve the above described goal and a method for manufacturing thereof. The above-described object can be accomplished by combinations of features of the independent claims. Dependent claims prescribe further useful concrete examples of the present invention.

SUMMARY OF THE INVENTION

In order to achieve the above described goals, the first aspect of the present invention provides a probe card electrically coupled to a plurality of contact terminals provided on a circuit under test for performing signal transmission between the circuit under test and an external semiconductor testing equipment, including: a substrate; a plurality of signal transmission paths formed on the substrate; and a plurality of contactors formed on ends of the plurality of signal transmission paths on one side of the substrate, wherein the plurality of contactors are made of an amorphous material (or, metallic glass material) including a supercooled liquid phase region and contacted to the contact terminals provided on the circuit under test.

According to the first aspect of the present invention, by forming a metallic glass contactor (minute probe pin) by micromachining technology, it is possible to provide a probe card which can transmit a high-frequency signal of more than 1 GHz frequency to an integrated circuit having a plurality of pads on a narrow area. Further, since micromachining is used, it is possible to manufacture a plurality of probe pins for high speed simultaneously.

According to a feature of the first aspect, the contactor is formed to be separated from the substrate.

According to another feature of the first aspect, the contactor is extended to a predetermined direction from a surface of the substrate. The predetermined direction is a direction away from the surface of said substrate.

According to another feature of the first aspect, the contactor is bent in a predetermined direction from said surface of said substrate.

According to another feature of the first aspect, the contactor has a vertical elasticity against a surface of the substrate.

According to another feature of the first aspect, the contactor has vertical elasticity against the surface of said substrate in order to slide on the contact terminal of the circuit under test when they are contacted.

According to another feature of the first aspect, each of the plurality of the contactors has elasticity against the surface of said substrate. Each of the plurality of the contactors has different elasticity against the surface of said substrate.

According to another feature of the first aspect, at least a portion of the signal transmission path near the end of it is made of the same amorphous material used for the contactor. In this case, a portion of the signal transmission path near the end of it forms a single body together with the contactor.

According to another feature of the first aspect, the probe card further includes a grounding line, which is grounded, formed to be apart from and in parallel to the signal transmission path.

According to another feature of the first aspect, the probe card further includes a low-resistance unit having lower resistance than that of the signal transmission path, the low-resistance unit being formed near the signal transmission path.

According to another feature of the first aspect, the low-resistance unit is made of gold, copper, nickel, aluminum, platinum or rhodium.

According to another feature of the first aspect, the contactor includes a contacting point made of a contact-point material on an end of it.

According to another feature of the first aspect, the contactor is coated with a metal material.

According to another feature of the first aspect, the probe card further includes a voltage providing unit for providing a predetermined voltage, the voltage providing unit being provided on a backside of the one side of the substrate.

According to another feature of the first aspect, the voltage providing unit is a grounding conductor which is grounded.

According to another feature of the first aspect, the voltage providing unit is formed on an area other than areas of the backside of the substrate corresponding to areas of the one side of the substrate where the contactors are formed.

According to another feature of the first aspect, the substrate is made of a dielectric material or a semiconductor material, and the signal transmission path, the substrate and the grounding conductor form a microstrip line having predetermined characteristic impedance.

According to another feature of the first aspect, the probe card is formed on one side of the substrate and further includes a ground conductor layer, which is grounded, and a dielectric layer made of a dielectric material near the grounding conductor, and the signal transmission path is formed near the dielectric layer, and the signal transmission path and the dielectric layer form a microstrip line having a predetermined characteristic impedance.

According to another feature of the first aspect, the signal transmission path has a parallel transmitting unit formed to be in parallel with the surface of the substrate.

According to another feature of the first aspect, the signal transmission path has a penetrating-transmitting unit which is formed to penetrate the substrate in a direction of its thickness.

According to another feature of the first aspect, the signal transmission path has an internal transmitting unit extended in parallel with the surface of the substrate inside the substrate.

According to another feature of the first aspect, the signal transmission path has internal transmitting units disposed at different distances from the surface of the substrate.

According to another feature of the first aspect, a probe card further includes a plurality of contactors made of an amorphous material having a supercooled liquid phase region, wherein the plurality of contactors are electrically coupled to the contactors formed on one side of the substrate through the signal transmission paths and formed on the backside of the substrate.

According to another feature of the first aspect, the contactor has a sharp end which narrows towards the end.

According to another feature of the first aspect, the contactor has a two-fingered fork shape end, where each of the fingers has a sharp end.

In order to achieve the above described goals, the second aspect of the present invention provides a method for forming a contactor on a substrate of a probe card electrically coupled to a plurality of contact terminals provided on a circuit under test for performing signal transmission between the circuit under test and external semiconductor testing equipment, the contactor contacting to the contact terminal, including steps of: forming a sacrificial layer on a predetermined area of the substrate; forming an amorphous material layer including an amorphous material having a supercooled liquid phase region on the sacrificial layer and the substrate; forming a cantilever of an amorphous material including a free unit as a portion of it by removing the sacrificial layer between a portion of the amorphous material layer and the substrate, the free unit being separated from the substrate; and forming the contactor by bending the free unit toward a predetermined direction from the substrate.

According to another feature of the second aspect, there is provided a method for forming a contactor on a substrate of a probe card electrically coupled to a plurality of contact terminals provided on a circuit under test for performing signal transmission between the circuit under test and an external semiconductor testing equipment, the contactor contacting to the contact terminal, including steps of: forming an amorphous material layer including an amorphous material having a supercooled liquid phase region on the substrate; forming a free unit on a portion of the amorphous material layer by removing a portion of the substrate under the portion of the amorphous material layer, the free unit being separated from the substrate; and forming the contactor by bending the free unit toward a predetermined direction from the substrate.

According to another feature of the second aspect, the step for forming a contactor includes a step for bending the free unit away from the substrate.

According to another feature of the second aspect, the amorphous material layer is formed by sputtering the amorphous material.

According to another feature of the second aspect, the step for forming the contactor includes a step for causing a plastic deformation of the free unit toward a predetermined direction from the substrate.

According to another feature of the second aspect, the step for forming the contactor includes a step for heating the free unit.

According to another feature of the second aspect, the step for forming the contactor includes a step for heating the free unit when the free unit is disposed under the substrate.

According to another feature of the second aspect, the step for forming the contactor includes a step for irradiating infrared light on the free unit.

According to another feature of the second aspect, the step for forming the contactor includes a step for irradiating infrared light on the free unit from both sides of the substrate.

According to another feature of the second aspect, the step for forming the contactor includes a step for providing a bending adjustor at a predetermined position toward a direction of gravity from the surface of the substrate.

According to another feature of the second aspect, the step for forming the contactor includes a step for providing a bending adjustor of higher transmittance for infrared light than the substrate.

According to another feature of the second aspect, the step for forming the contactor includes a step for providing a bending adjustor having flatness less than +/−10 um.

According to another feature of the second aspect, the step for forming the contactor includes a step for providing a bending adjustor having flatness less than +/−2 um.

According to another feature of the second aspect, the step for forming the contactor includes a step for providing a quartz glass substrate as a bending adjustor.

According to another feature of the second aspect, the step for forming the contactor includes a step for providing a quartz glass substrate including a position determining unit for determining the predetermined position toward a direction of gravity from the surface of the substrate.

According to another feature of the second aspect, the step for forming the contactor includes a step for providing a bending adjusting member including an engaging unit for suppressing movement of the substrate in a direction of gravity and a bending adjustor for determining the predetermined position toward a direction of gravity from the surface of the substrate.

According to another feature of the second aspect, the step for forming the contactor includes a step for controlling the amount of bending of the free unit by changing thickness of the bending adjustor.

According to another feature of the second aspect, the step for forming the contactor includes a step for providing a bending adjusting member having the bending adjustor made of a quartz glass substrate.

According to the third aspect of the present invention, there is provided a semiconductor chip including: a plurality of pads; and a plurality of contactors made of an amorphous material having a supercooled liquid phase region on the plurality of pads, wherein the contactor is extended to a predetermined direction from a surface of the pads.

According to another feature of the third aspect, the contactor is extended to a direction away from the substrate.

According to the third aspect of the present invention, there is provided a semiconductor device including a semiconductor chip having a plurality of pads, including: a plurality of electrode leads; and a package which packs the semiconductor chip, wherein the pads of the semiconductor chip and the electrode leads are electrically coupled to each other through contactors made of an amorphous material having a supercooled liquid phase region.

According to the third aspect of the present invention, there is provided a semiconductor device including a semiconductor chip having a plurality of pads, including: a plurality of external terminal balls; and a package which packs the semiconductor chip, wherein the pads of the semiconductor chip and the external terminal balls are electrically coupled to each other through contactors made of an amorphous material having a supercooled liquid phase region.

The above description does not necessarily list all features of the present invention, and combinations of the above features also can be construed as aspects of the present invention.

BRIEF DESCRIPTION OF THE DRAWINGS

FIG. 29 shows cross sectional views of a probe card during processes of the first step of the method for forming a contactor according to the second embodiment of the present invention.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 8:
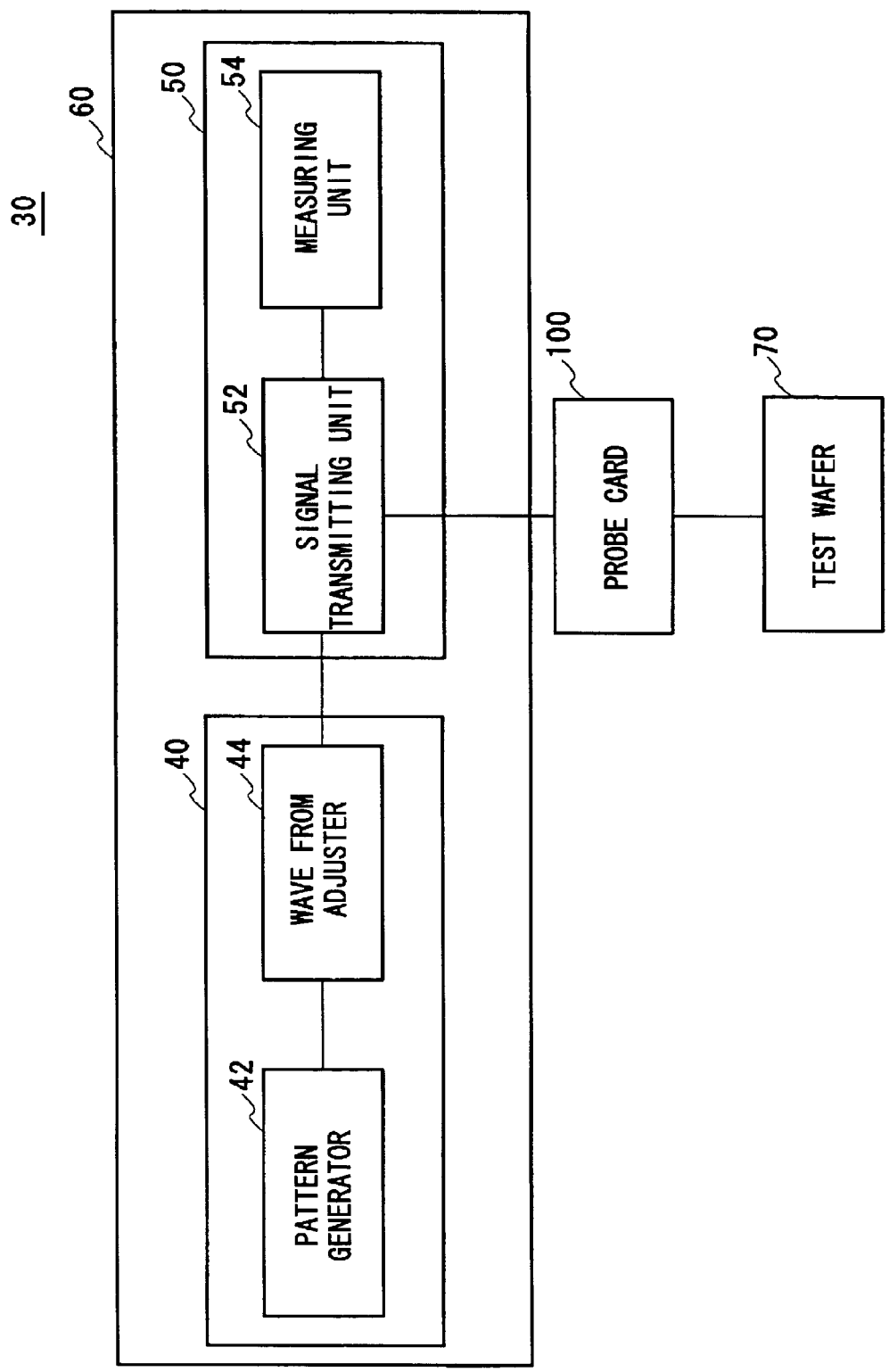
FIG. 8 shows an embodiment of a semiconductor testing system 30 for testing a circuit formed on a wafer 70 under test.

FIG. 8 shows an embodiment of a semiconductor testing system 30 for testing a circuit formed on a wafer 70 under test. The semiconductor testing system 30 includes semiconductor testing equipment 60 and a probe card 100. The semiconductor testing equipment 60 includes a testing equipment body 40 and a test head 50. The testing equipment body 40 includes a pattern generator 42 and a waveform adjuster 44. The test head 50 includes a signal transmitting unit 52 and a measuring unit 54. The probe card 100 includes a contactor (not shown) which contacts to a contact terminal of the circuit formed on the wafer 70 under test. A signal transmitted from the signal transmitting unit 52 is transmitted to the wafer 70 under test through the probe card 100, and a signal outputted from the wafer 70 under test is transmitted to the signal transmitting unit 52 through the probe card 100.

The pattern generator 42 generates test signals used for testing an integrated circuit manufactured on the wafer 70 under test. The test signals are provided to the waveform adjuster 44, where the waveforms of the test signals are adjusted according to input characteristics of the integrated circuit under test. The test signals, of which waveforms are adjusted, are transmitted to the signal transmitting unit 52 and then provided to the wafer 70 under test through the probe card 100 from the signal transmitting unit 52. Then, the wafer 70 under test provides output signals based on the test signals, and the output signals are provided to the signal transmitting unit 52 through the probe card 100. The signal transmitting unit 52 provides output signals from the wafer 70 under test to the measuring unit 54. The measuring unit 54 determines whether the wafer 70 under test is good or bad based on the output signals.

Figure 9:
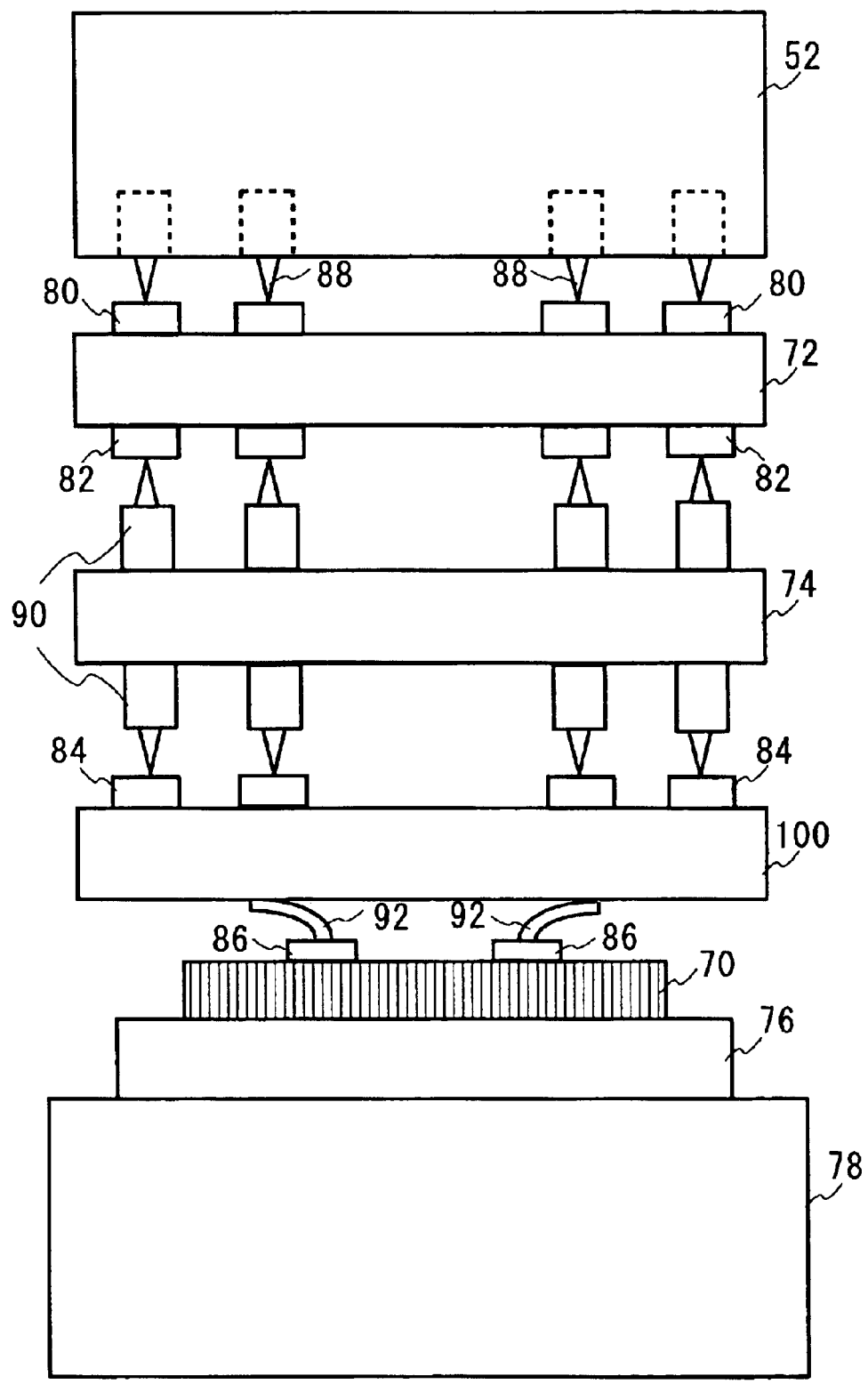
FIG. 9 shows an embodiment of a signal transmitting system which performs signal transmission between the signal transmitting unit 52 and the wafer 70 under test shown in FIG. 8.

FIG. 9 shows an embodiment of a signal transmitting system which performs signal transmission between the signal transmitting unit 52 and the wafer 70 under test shown in FIG. 8. In FIG. 8, only probe card 100 is shown between the signal transmitting unit 52 and the wafer 70 under test, but, as shown in FIG. 9, the signal transmitting system may include a performance board 72 and an interface 74 for coupling the performance board 72 and the probe card 100, in addition to the probe card 100. The wafer 70 under test is fixed by a wafer chuck 76 provided on a moving stage 78. The test signals are transmitted through the performance board 72, the interface 74 and the probe card 100 between the signal transmitting unit 52 and the wafer 70 under test.

A plurality of contactors 88 protrude from a lower side of the signal transmitting unit 52. The performance board 72 includes a plurality of pads 80 and 82 on upper and lower sides, respectively. The interface 74 is provided with a plurality of "pogo-pins" 90, each of which has longitudinal elasticity, as contactors. The probe card 100 includes a plurality of pads 84 on its upper side, and a plurality of contactors 92 as probes on its lower side.

As shown in FIG. 9, according to the present embodiment, the contactor 88 is contacted to pad 80, and pogo pins 90 on both sides are respectively contacted to pads 82 and 84. Further, the contactor 92 of the probe card 100 according to the present invention is contacted to the pad 86 of the wafer 70 under test. According to the present invention, the contactor 92 is made of amorphous material shaving a supercooled liquid phase region ("metallic glass material", hereinafter). It is a characteristic feature of the metallic glass material to show viscous fluidity in the supercooled liquid phase region. Further, in this specification, the "supercooled liquid phase region" is defined to be a temperature range from the glass-transition temperature to the temperature on which crystallization is started. When the pads are electrically coupled through the contactors, signal transmission between the signal transmitting unit 52 and the wafer 70 under test becomes available.

According to FIG. 9, as parts of the signal transmitting system, the performance board 72 and the interface 74 are included, but they are not essential and, as shown in FIG. 8, the probe card 100 may be directly coupled to the signal transmitting unit 52.

Figure 10:
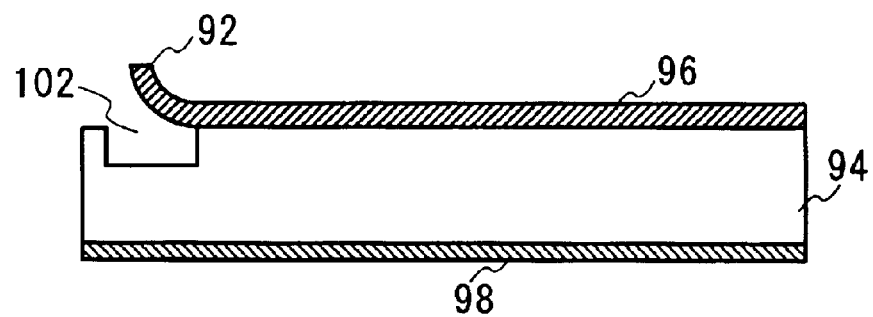
FIG. 10 shows a portion of a cross-sectional view of a probe card 100 according to the first embodiment of the present invention.

FIG. 10 shows a portion of a cross-sectional view of a probe card 100 according to the first embodiment of the present invention. The probe card 100 is electrically coupled to the plurality of contact terminals provided on the circuit under test, and performs a function of transmitting signals between the circuit under test and the external semiconductor testing equipment. The probe card 100 includes a contactor 92, a substrate 94, a signal transmission path 96, a grounding conductor 98 and a hole 102.

The signal transmission path 96 is formed on the substrate 94. The substrate 94 is made of a dielectric or semiconductor material. The contactor 92 is made of a metallic glass material on an end portion of the signal transmission path 96 on one side of the substrate 94. By using micromachining technology on the metallic glass materials, it is possible to form the contactor 92 extremely minute and also to form a plurality of the contactors 92 substantially simultaneously. The contactor 92 is formed to be away from the substrate 94 over the hole 102. For example, the contactor 92 may be formed to be extended away from the substrate 94. According to the structure shown in FIG. 10, the contactor 92 is formed to be bended away from the substrate 94. Further, the contactor 92 includes a straight portion extended away from the substrate 94 in a predetermined angle with the substrate 94.

Since the contactor 92 is formed to be extended away from the substrate 94, the contactor 92 has elasticity in a vertical direction against the surface of the substrate 94. Therefore, the contactor 92 can elastically contact to the contact terminal formed on the circuit under test during a test. The contactor 92 pushes out dirt on the contact terminal (pad) and breaks through oxidized film by contacting to and sliding against (scrub operation) the pad of the circuit under test, so that sufficiently low contact resistance is preferably achieved. According to the present embodiment, the contactor 92 has elasticity in a vertical direction against the surface of the substrate 94 in order to be contacted to and slide on the contact terminal provided on the circuit under test.

In order to achieve reliable electric contacts of all of the contactors 92 to the contact terminals (pads) of the circuit under test, it is preferable for each of the contactors 92 to slide independently on the terminals (scrub operation). According to the present embodiment, each of the contactors 92 has independent elasticity in a vertical direction against the surface of the substrate 94 and can achieve reliable electric contact to each of the contact terminals.

According to the embodiment shown in FIG. 10, a grounding conductor 98, which is grounded, is provided on the other side of the substrate 94, on one side of which the contactor 92 is provided. According to this embodiment, the grounding conductor 98 is an example of a voltage providing unit which provides a predetermined voltage. In other words, the grounding conductor 98 maybe a voltage providing unit which can provide a predetermined offset voltage. The grounding conductor 98 may provide grounding voltage.

The grounding conductor 98 may be preferably made of a metal. From a view point of manufacturing the contactor 92, it is preferable to form the grounding conductor 98 on an area of one side of the substrate 94 other than areas corresponding to the area on which the contactor 92 is formed on the other side of the substrate 94. In other words, it is preferable not to form the grounding contactor 98 on an area of one side of the substrate 94 corresponding to the area of the other side of the substrate 94 on which the contactor 92 is formed. The manufacturing process is described in detail later, but it is preferable not to form the grounding conductor 98, which is a metal, on an area of one side of the substrate 94 corresponding to the area of the other side of the substrate 94 on which the contactor 92 is formed in order to radiate infrared light on the contactor 92 from both sides of the substrate 94.

The signal transmission path 96 is formed to constitute a microstrip line having a predetermined characteristic impedance with the substrate 94 and the grounding conductor 98. The characteristic impedance of the microstrip line is determined by the kind of dielectric forming the substrate 94, thickness of the substrate 94 and width of the signal transmission path 96, and it is preferable to maintain an impedance matching state to the base of the contactor 92. Further, from the view point of strength requirement, it is preferable to make at least a portion of the signal transmission path 96 near the end of it with the same metallic glass material used for the contactor 92. In this case, it is preferable to form at least the portions near the end of the signal transmission path 96 to be integrated with the contactor 92. According to the first embodiment of the present invention, the signal transmission path 96 shown in FIG. 10 is made of a metallic glass material, but it is also preferable to make almost all portions of the signal transmission path 96 with a metal of which resistance is lower than that of metallic glass material in order to lower resistance of the signal transmission path 96. But, as described above, because of the strength requirement, the portions near the end of the signal transmission path 96 are preferably made of metallic glass material together with the contactor 92 in the manufacturing process of the contactor 92.

Figure 11:
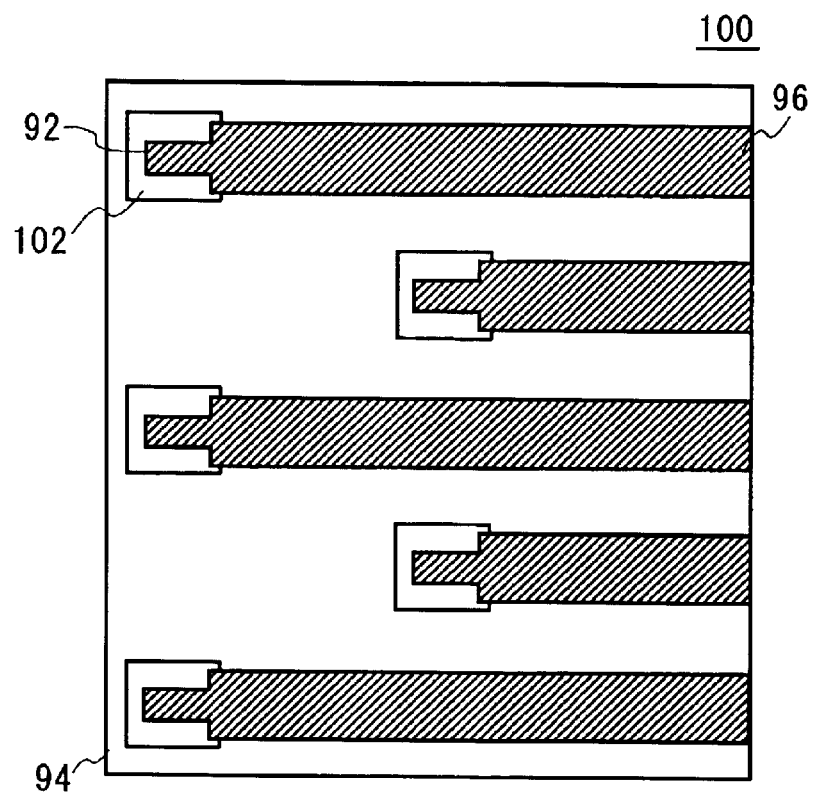
FIG. 11 shows a portion of a plane view of the probe card 100 of an embodiment of the present invention.
Figure 11:
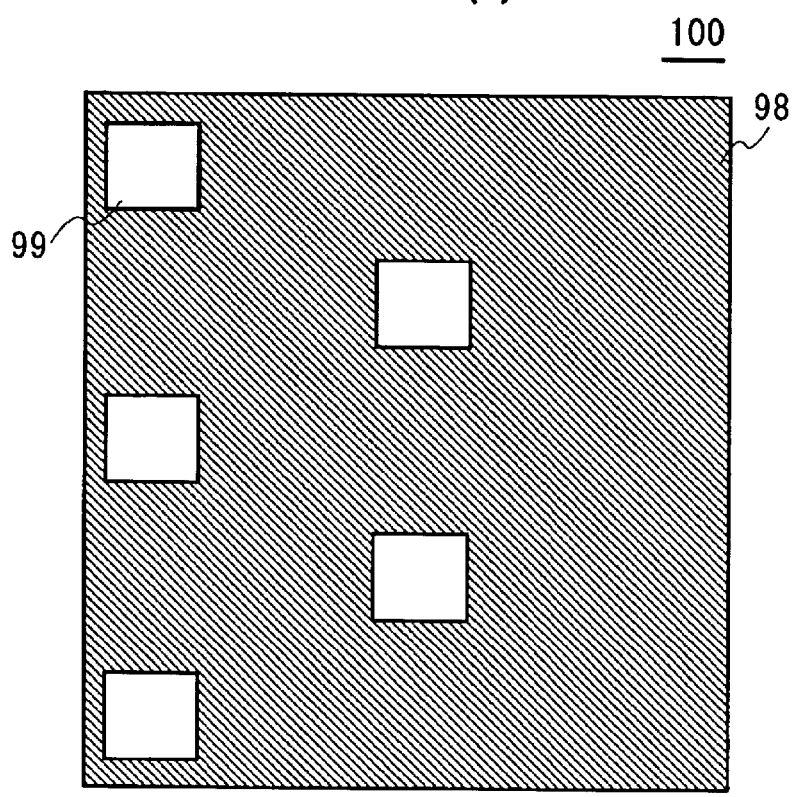

FIG. 11(a) shows one side of the probe card 100 on which a plurality of contactors are formed. The plurality of contactors 92 are disposed at the same pitch with that between contact terminals (pads) of the circuit manufactured on the wafer under test. The pitch between at least the end portions of the signal transmission paths 96 is the same with that between the contactors 92. The signal transmission path 96 includes a parallel transmission path formed to be parallel to the surface of the substrate. A parallel transmission path is also parallel to another parallel transmission path. Since the contactor 92 of the present invention is made of a metallic glass material by micromachining technology, it is possible to dispose a plurality of contactors 92 corresponding to a plurality of pads on a narrow pitch area. It is also possible to dispose the contactor 92 corresponding to pads disposed in an a real array on the circuit under test.

FIG. 11(b) shows a portion of a back surface of the probe card to the side where contactors are formed. According to FIG. 11(b), a grounding conductor 98 is not formed on a location 99 of the back surface of the side where the contactor is formed, wherein the location 99 corresponds to the location of the contactor. As described above with reference to FIG. 10, from the view point of a manufacturing process, it is preferable not to form the grounding conductor 98 on the location 99.

Figure 12:
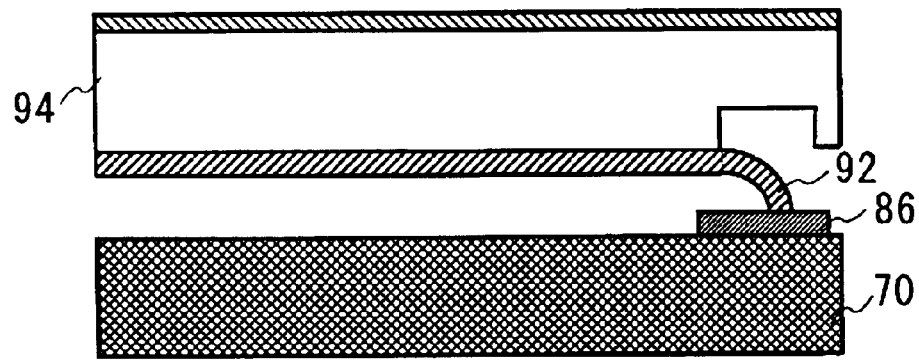
FIG. 12 shows a contactor 92 of the probe card 100 contacted to a pad 86 of the wafer 70 under test during a test.

FIG. 12 shows a contactor 92 of the probe card 100 contacted to a pad 86 of the wafer 70 under test during a test. As described above, each of the plurality of contactors 92 has elasticity in a vertical direction against the surface of the substrate 94. Therefore, the contactor 92 can make a reliable electric contact with the pad 86 in spite of the height variations of the pad 86 and/or contactor 92. With the reliable electric contact between the contactor 92 and the pad 86, it is possible to reliably transmit test signals during a test.

Further, there is an oxidized layer on the surface of the pad 86, but it is required to make a reliable contact between the pad 86 and the contactor 92 during a test. Thus, it is preferable for the contactor 92 to press and slide on (scrub) the pad 86. In other words, the contactor 92 is contacted to the pad 86 so that it rubs the surface of the pad 86 and can make reliable electric contact with the pad 86.

Figure 13:
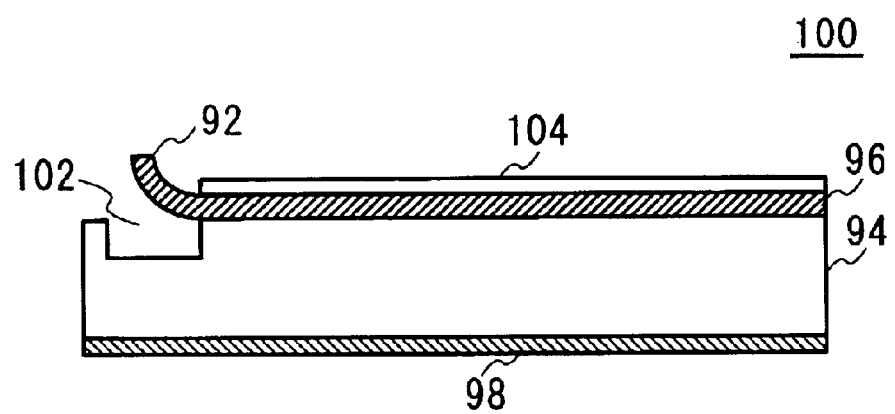
FIG. 13 shows a portion of a cross sectional view of a probe card 100 according to the second embodiment of the present invention.

FIG. 13 shows a portion of a cross sectional view of a probe card 100 according to the second embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102 and a low-resistance unit 104. Elements designated by the same reference numbers with those shown in FIG. 10 have the same functions of the corresponding elements shown in FIG. 10.

The probe card 100 includes a low-resistance unit 104 near the signal transmission path 96, and the low-resistance unit is made of a conductor having lower resistance than that of the signal transmission path 96. To be concrete, the low-resistance unit 104 is formed on the signal transmission path 96. In other words, according to the second embodiment, both the low-resistance unit 104 and the signal transmission path 96 in unison function as a signal-transmitting path of low resistance through which signals are transmitted. As described above with reference to FIG. 10, from the view point of strength requirement, it is preferable to make at least a portion of the signal transmission path 96 near the end of it with the same metallic glass material used for the contactor 92. In this case, it is also preferable to form the low-resistance unit 104, of which resistance is lower than that of metallic glass material, near the signal transmission path 96 in order to lower resistance of the whole signal-transmitting path. The low-resistance unit 104 is preferably made of a low-resistance material, such as gold, copper, nickel, aluminum, platinum or rhodium. By forming the low-resistance unit 104 near the signal transmission path 96, currents flow mainly through the low-resistance unit 104. As a result, it is possible to maintain resistance of the whole signal-transmitting path of the signal transmission path 96 and the low-resistance unit 104 at a low level, so that attenuation of high frequency components can be decreased.

Figure 14:
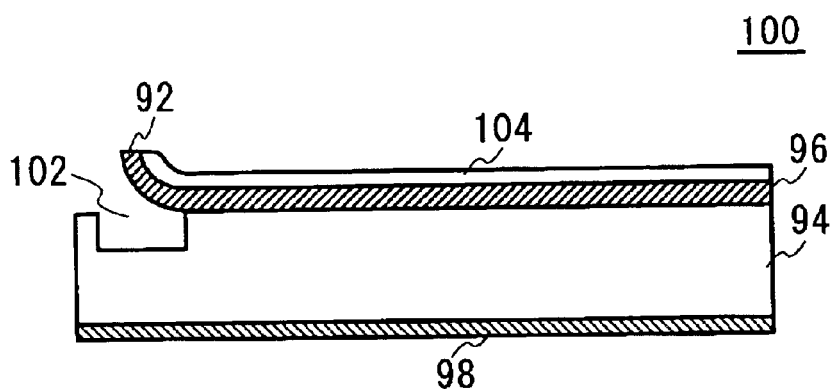
FIG. 14 shows a portion of a cross sectional view of a probe card 100 according to the third embodiment of the present invention.

FIG. 14 shows a portion of a cross sectional view of a probe card 100 according to the third embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102 and a low-resistance unit 104. Elements designated by the same reference numbers with those shown in FIG. 10 have the same functions of the corresponding elements shown in FIG. 10.

Compared to that shown in FIG. 13, the low-resistance unit 104 of the probe card 100 shown in FIG. 14 is further extended near to the contactor 92. In other words, according to the probe card 100, the contactor 92 is coated by a metal material as well as the signal transmission path 96. Therefore, it is possible to maintain resistance of the contactor 92 and the signal transmission path 96 at a low level, so that attenuation of high frequency components can be further decreased.

Figure 15:
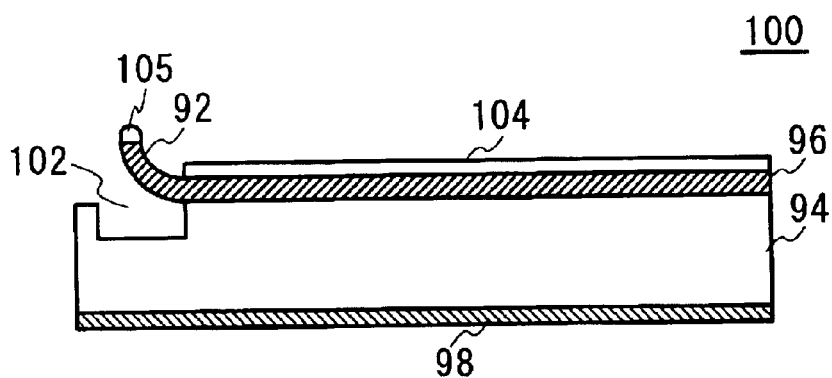
FIG. 15 shows a portion of a cross sectional view of a probe card 100 according to the fourth embodiment of the present invention.

FIG. 15 shows a portion of a cross sectional view of a probe card 100 according to the fourth embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102, a low-resistance unit 104 and a contacting unit 105. Elements designated by the same reference numbers with those shown in FIG. 10 have the same functions of the corresponding elements shown in FIG. 10.

Compared to that shown in FIG. 13, according to the probe card 100 shown in FIG. 15, a contacting unit 105 is formed on the end of the contactor 92. The contacting unit 105 is made of a metal material and may be preferably made of the same metal material with that used for the low-resistance unit 104. By forming the contacting unit 105 of low resistance and the contactor 92 on the end of the contactor 92, it is possible to make a low-resistance contact between the contact terminal (pad) 86 of the circuit 70 under test and the contacting unit 105.

Figure 16:
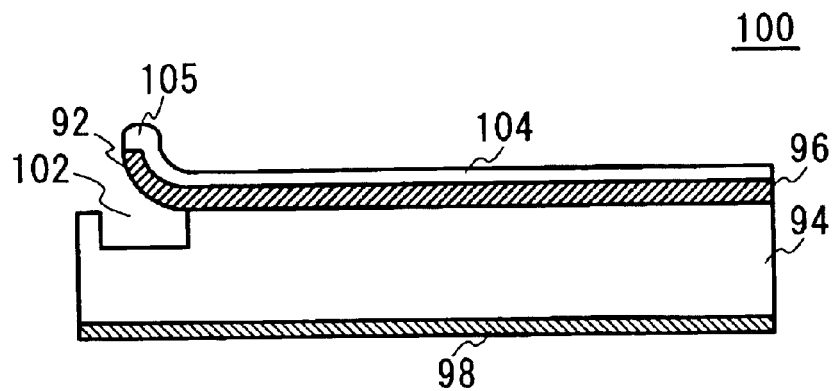
FIG. 16 shows a portion of a cross sectional view of a probe card 100 according to the fifth embodiment of the present invention.

FIG. 16 shows a portion of a cross sectional view of a probe card 100 according to the fifth embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102, a low-resistance unit 104 and a contacting unit 105. Elements designated by the same reference numbers with those shown in FIG. 10 have the same functions of the corresponding elements shown in FIG. 10.

Compared to that shown in FIG. 13, according to the probe card 100 shown in FIG. 16, the low-resistance unit 104 is further extended near to the contactor 92 and a contacting unit 105 is formed on the end of the contactor 92. The low-resistance unit 104 and contacting unit 105 are respectively made of a metal material and may be preferably made of the same metal material. The probe card 100 shown in FIG. 16 exploits both results of the probe cards shown in FIGS. 14 and 15.

Figure 17:
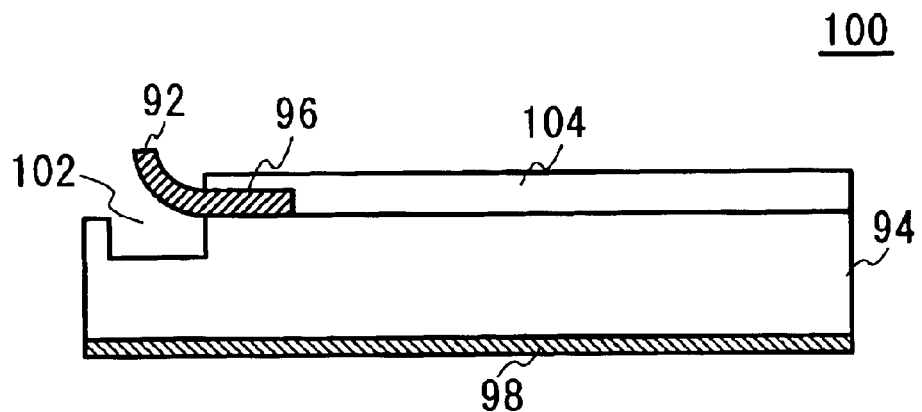
FIG. 17 shows a portion of a cross sectional view of a probe card 100 according to the sixth embodiment of the present invention.

FIG. 17 shows a portion of a cross sectional view of a probe card 100 according to the sixth embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102 and a low-resistance unit 104. Elements designated by the same reference numbers with those shown in FIG. 10 have the same functions of the corresponding elements shown in FIG. 13.

Compared to that shown in FIG. 13, according to the probe card 100 shown in FIG. 17, both the signal transmission path 96 and the low-resistance unit 104 perform a function of a signal-transmitting path through which signals are transmitted, as in the case of FIG. 13. Unlike the probe card shown in FIG. 13, however, according to the probe card 100 shown in FIG. 17, the signal transmission path 96 is formed to be shorter than that shown in FIG. 13, and the low-resistance unit 104 mainly transmits signals, which is clearly shown in FIG. 17. In the case of the probe card 100 shown in FIG. 13, it is also possible to form almost the entire portion of the signal transmission path 96 with a material of high conductivity (low resistance), as described above with reference to FIG. 10. In the case of the sixth embodiment, at least a portion of the signal transmission path 96 may be preferably made of a metallic glass material in order to achieve the strength requirement of the contactor 92. As a result, it is possible to maintain resistance of the whole signal-transmitting path of the signal transmission path 96 and the low-resistance unit 104 at a low level, so that attenuation of high frequency components can be decreased.

Figure 18:
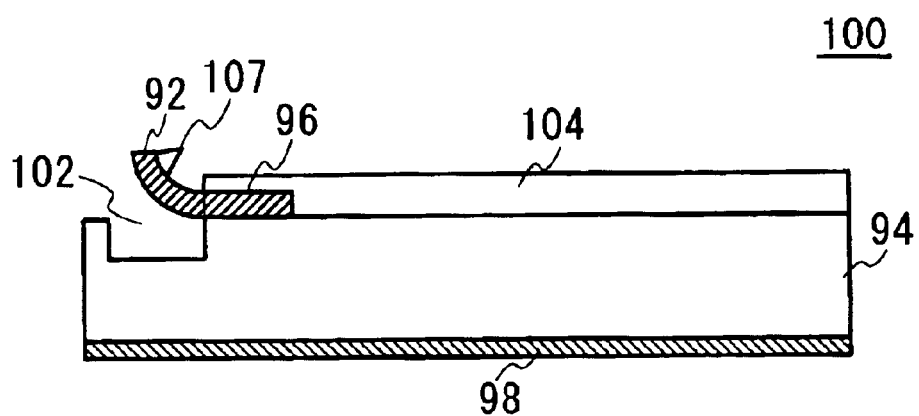
FIG. 18 shows a portion of a cross sectional view of a probe card 100 according to the seventh embodiment of the present invention.

FIG. 18 shows a portion of a cross sectional view of a probe card 100 according to the seventh embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102, a low-resistance unit 104 and a contacting point 107. Elements designated by the same reference numbers with those shown in FIG. 13 have the same functions of the corresponding elements shown in FIG. 13.

Compared to that shown in FIG. 17, according to the probe card 100 shown in FIG. 18, both the signal transmission path 96 and the low-resistance unit 104 perform a function of a signal-transmitting path through which signals are transmitted, as in the case of FIG. 17. According to the seventh embodiment of the present invention, a contacting point 107 is provided on the end of the contactor 92 and the contacting point 107 contacts to the contact terminal provided on the circuit under test. The contacting point 107 is preferably made of a "contact-point material". The contact-point material is defined to be a material having high electric conductivity, high thermal conductivity, low contact-resistance, low adhesiveness, poor welding characteristic and high corrosion-resistance. Since the contacting point 107 directly contacts to the contact terminal of the circuit under test, stable signal transmission is achieved. Moreover, by coating the surface of the contactor 92 other than the area where the contacting point 107 is provided with a metal material, attenuation of high frequency components can be decreased.

Figure 19:
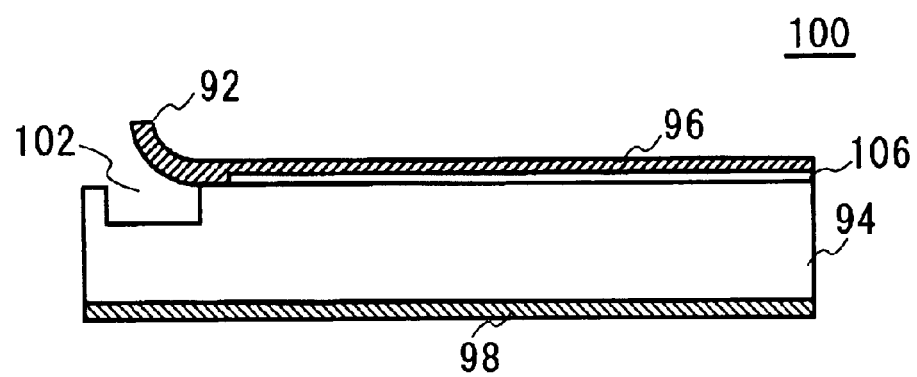
FIG. 19 shows a portion of a cross sectional view of a probe card 100 according to the eighth embodiment of the present invention.

FIG. 19 shows a portion of a cross sectional view of a probe card 100 according to the eighth embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102 and a low-resistance unit 106. Elements designated by the same reference numbers with those shown in FIG. 10 have the same functions of the corresponding elements shown in FIG. 10.

According to FIG. 19, a low-resistance unit 106 is formed near the signal transmission path 96, and the low-resistance unit is made of a conductor having lower resistance than that of the signal transmission path 96. To be concrete, the low-resistance unit 106 is formed on the signal transmission path 96. It is preferable that at least a portion of the signal transmission path 96 is directly attached to the substrate 94. As described above with reference to FIG. 10, from the view point of strength requirement, it is preferable to make at least a portion near the end of the signal transmission path 96 with the same metallic glass material used for the contactor 92. As a result, since the electric resistance of the whole signal-transmitting path is decreased, it is preferable to form the low-resistance unit 106 having lower electric resistance than the metallic glass material near the signal transmission path 96. The low-resistance unit 106 is made of a metal, preferably gold. Further, as described above with reference to FIG. 13, the low-resistance unit 106 may be made of other low-resistance metal, such as copper, nickel, aluminum, platinum or rhodium. By forming the low-resistance unit 106 near the signal transmission path 96, currents are flowing mainly through the low-resistance unit 106. As a result, it is possible to maintain resistance of the signal transmission path 96 at a low level, so that attenuation of high frequency components can be decreased. Since the high frequency components of currents flowing through the signal-transmitting path mainly flow on the surface facing the grounding conductor 98, the high frequency components of the current can easily pass by forming the low-resistance unit 106 under the signal transmission path 96.

Figure 20:
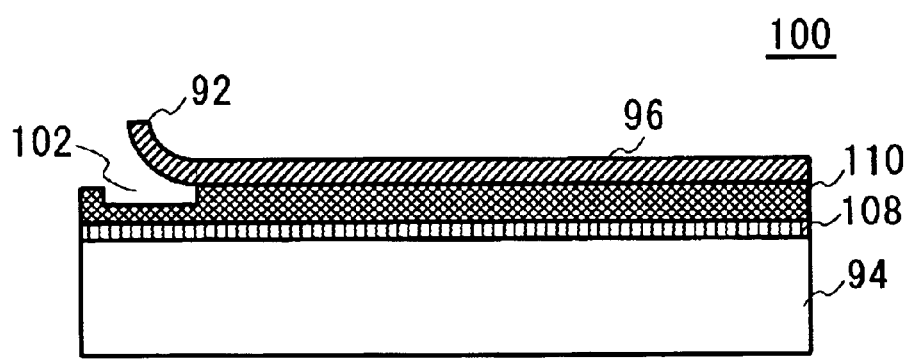
FIG. 20 shows a portion of a cross sectional view of a probe card 100 according to the ninth embodiment of the present invention.

FIG. 20 shows a portion of a cross sectional view of a probe card 100 according to the ninth embodiment of the present invention. The probe card 100 is electrically coupled to the plurality of contact terminals formed on the circuit under test, and has a function of transmitting signals between the circuit under test and the external semiconductor testing equipment. The probe card 100 includes a contactor 92, a substrate 94, a signal transmission path 96, a grounding conductor 98, a hole 102, a grounding conductor layer 108 and a dielectric layer 110. Elements designated by the same reference numbers with those shown in FIG. 10 have the same functions of the corresponding elements shown in FIG. 10.

According to FIG. 20, a grounding conductor layer 108, which is grounded, is formed on one side of the substrate 94. A dielectric layer 110, which is made of a dielectric material, is formed near the grounding conductor layer 108. The dielectric material 110 maybe made of a different material from that used for the substrate 94. According to the ninth embodiment, the signal transmission path 96 is formed near the dielectric layer 110.

According to the probe card 100 shown in FIG. 10, the signal transmission path 96 forms a microstrip line, which has a predetermined characteristic impedance, together with the substrate 94 and the grounding conductor 98. The characteristic impedance of the microstrip line is determined by dielectric material used for the substrate 94, thickness of the substrate 94 and width of the signal transmission path 96. In this case, because of the strength requirement, the thickness of the substrate 94 should be more than a predetermined thickness, and the kind of dielectric material may be limited.

According to the probe card 100 shown in FIG. 20, the signal transmission path 96 together with the grounding conductor layer 108 and the dielectric layer 110 forms a microstrip line of a predetermined characteristic impedance. Therefore, the characteristic impedance of the microstrip line is not affected by the thickness or material of the substrate 94 which is restricted by the strength requirement but determined by thickness and material of the dielectric layer 110 and width of the signal transmission line 96. Therefore, by controlling the thickness and material of the dielectric layer 110, it is possible to form a minute signal transmission line 96. Thus, according to the probe card 100 shown in FIG. 20, it is possible to dispose the contactor 92 on a narrow pitch area while the impedance matching condition is maintained to the base of the contactor 92.

Figure 21:
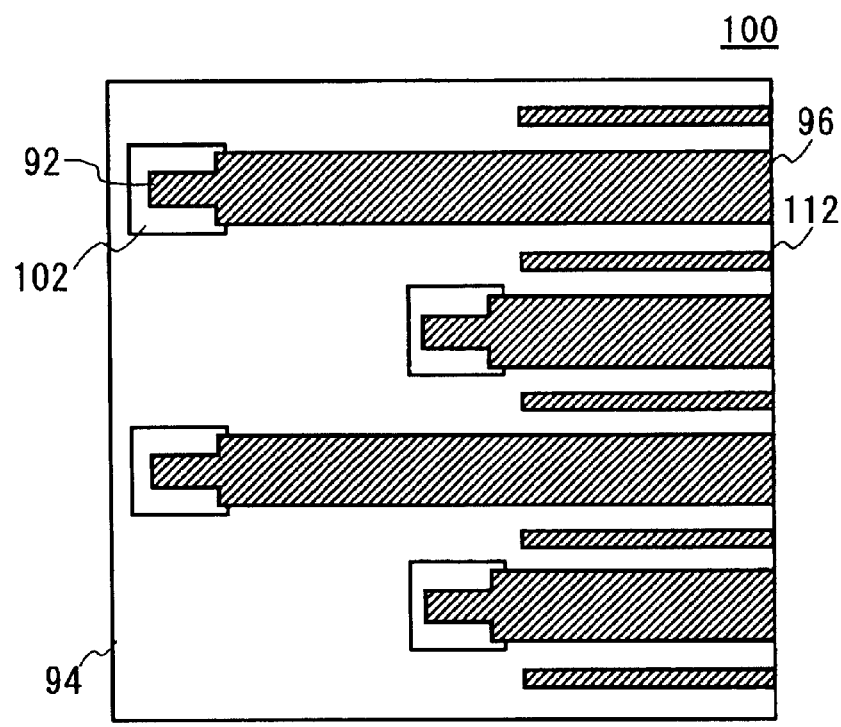
FIG. 21 shows a portion of a plane view of a probe card according to the tenth embodiment of the present invention.

FIG. 21 shows a portion of a plane view of a probe card according to the tenth embodiment of the present invention. The probe card 100 includes a contactor 92, a substrate 94, a signal transmission path 96, and a grounding line 112. The grounding line 112 is formed between neighboring signal transmission lines 96. As shown in FIG. 21, the grounding line 112 is formed apart from and in parallel with the signal transmission line 96. By forming the grounding line 112, it is possible to suppress cross talk among neighboring signal transmission lines 96. The signal transmission line 96 together with the parallel grounding line 112 forms coplanar lines, and can be applicable to high frequency signal transmission. In this case, the characteristic impedance is determined by the material of the substrate 94, width of the signal transmission path 96, width of the grounding line 112 and distance between the signal transmission path 96 and the grounding line 112.

Figure 22:
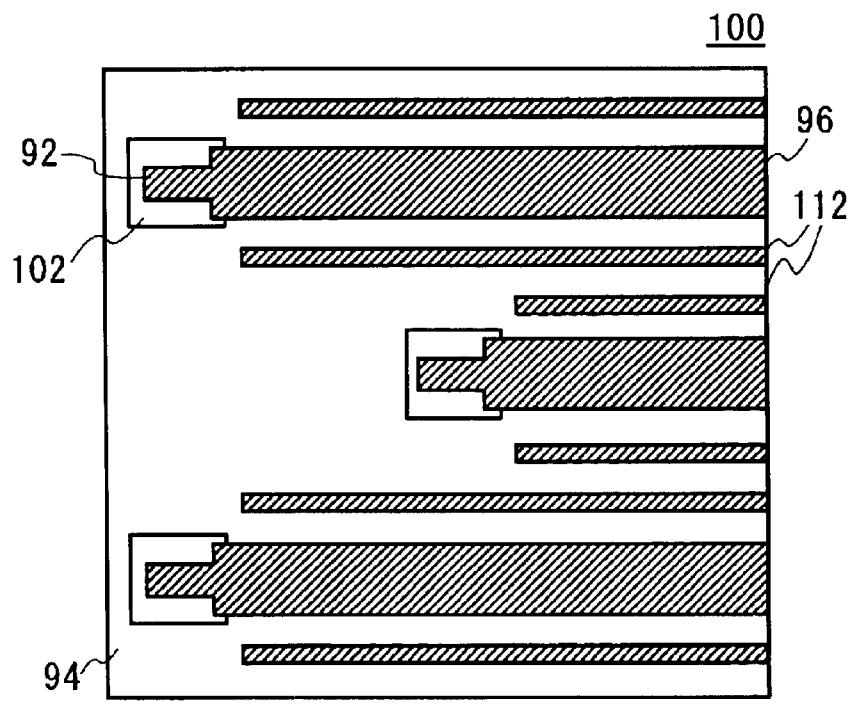
FIG. 22 shows a portion of a plane view of a probe card according to the eleventh embodiment of the present invention.

FIG. 22 shows a portion of a plane view of a probe card according to the eleventh embodiment of the present invention. The probe card 100 includes a contactor 92, a substrate 94, a signal transmission path 96, and a grounding line 112. According to the probe card 100, two grounding lines 112 are formed between neighboring signal transmission lines 96. Therefore, it is possible to further suppress cross talk among neighboring signal transmission lines 96 than the tenth embodiment shown in FIG. 21.

Figure 23:
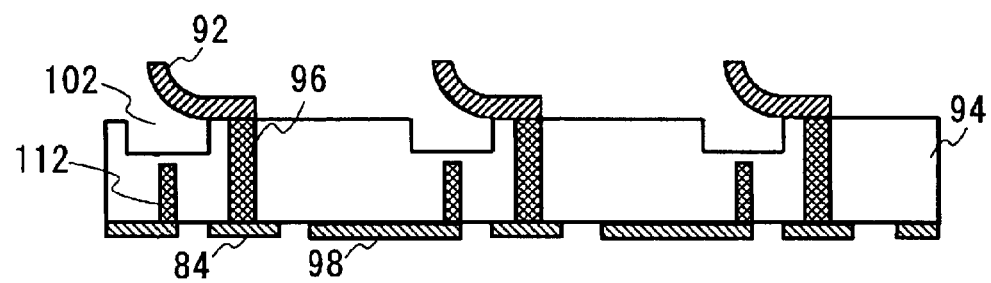
FIG. 23 shows a portion of a cross sectional view of a probe card 100 according to the twelfth embodiment of the present invention.

FIG. 23 shows a portion of a cross sectional view of a probe card 100 according to the twelfth embodiment of the present invention. The probe card 100 includes a contactor 92, a substrate 94, a signal transmission path 96, a grounding conductor 98, a hole 102, a grounding line 112 and a backside pad 84. The signal transmission path 96 includes a penetrating-transmitting unit which is formed to penetrate the substrate in a direction of its thickness. Input and/or output of signals to/from the contactor 92 is performed via the backside pad 84. The penetrating-transmitting unit is preferably made of a metal material of high conductivity.

The grounding line 112 is formed apart from and in parallel with the signal transmission path 96. According to the twelfth embodiment, the penetrating-transmitting unit of the signal transmission path 96 is formed in the direction of thickness of the substrate 94. By forming the grounding line 112, impedance matching of the penetrating-transmitting unit of the signal transmission path 96 is maintained, and it is possible to suppress cross talk among neighboring signal transmission paths 96. According to FIG. 23, one grounding line 112 corresponds to one signal transmission path 96, but, from the viewpoint of suppressing cross talk, a plurality of grounding lines 112 can correspond to one signal transmission path 96. Further, in case a plurality of contactors 92 are integrated, one grounding line 112 may correspond to a plurality of signal transmission lines 96.

Figure 24:
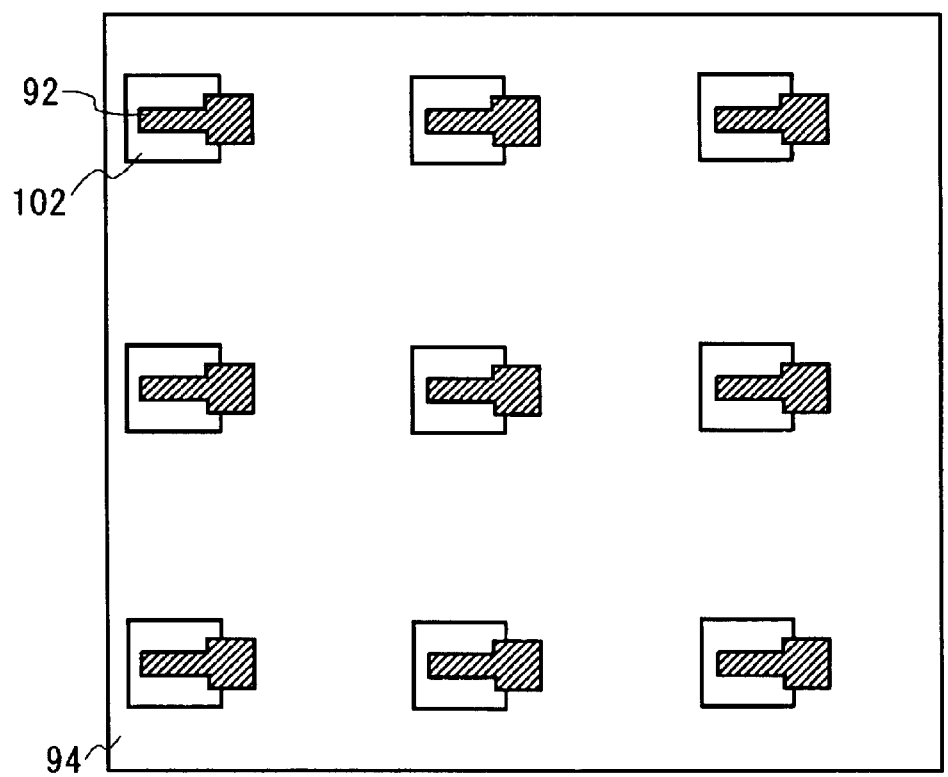
FIG. 24 shows a portion of a plane view of the probe card 100 according to the twelfth embodiment of the present invention shown in FIG. 23.

FIG. 24 shows a portion of a plane view of the probe card 100 according to the twelfth embodiment of the present invention shown in FIG. 23. According to this plane view, there are shown the contactors 92, the substrate 94 and the holes 102. According to the probe card 100, the contactors 92 are distributed on the substrate 94. This probe card 100 has an area-array adaptability so that it may be used for testing a circuit where contact terminals (pads) are distributed in a plane (area).

Figure 25:
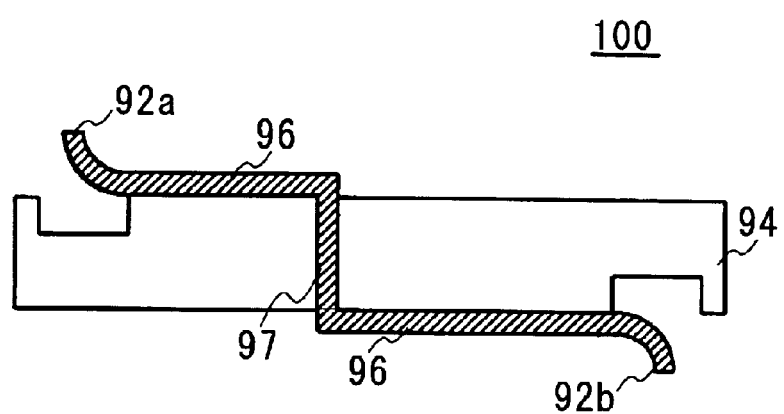
FIG. 25 shows a portion of a cross sectional view of a probe card 100 according to the thirteenth embodiment of the present invention.

FIG. 25 shows a portion of a cross sectional view of a probe card 100 according to the thirteenth embodiment of the present invention. This probe card 100 includes contactors 92a and 92b, a substrate 94 and a signal transmission path 96. As shown in the drawing, according to the probe card 100, the contactors are formed on both sides of the substrate 94. The contactor 92a is disposed on one side of the substrate 94 to correspond to a pad of the circuit under test, and the contactor 92b is formed on the backside of the substrate 94 in place of the pad 84 shown in FIG. 9. The signal transmission path 96 includes a penetrating-transmitting unit 97 for electrically connecting the contactors 92a and 92b. As described above with reference to FIG. 24, the penetrating-transmitting unit 97 is preferably made of a metal material of high conductivity (low resistance). Further, as described above, a portion of a parallel transmitting unit of the signal transmission path 96 elongated in parallel on the surface of the substrate 94 is preferably made of a metal material for enabling high speed signal transmission. The contactor 92b is made of a metallic glass as the contactor 92a.

By forming the contactor 92b on the surface of the backside of the substrate 94, the probe card 100 also has elasticity on its backside as well as the other side on which the circuit under test is contacted. Referring to FIG. 9, since the contactor 92b provided in place of the pad 84 is reliably contacted with the pogo-pin 90, the signal transmission between the interface 74 and the probe card 100 can be reliably made. Further, according to the thirteenth embodiment, since contactors 92a and 92b have elasticity on both sides of the probe card 100, it is possible for the contactor 92b to directly contact with the contactor 88 of the signal transmission path 52.

Figure 26:
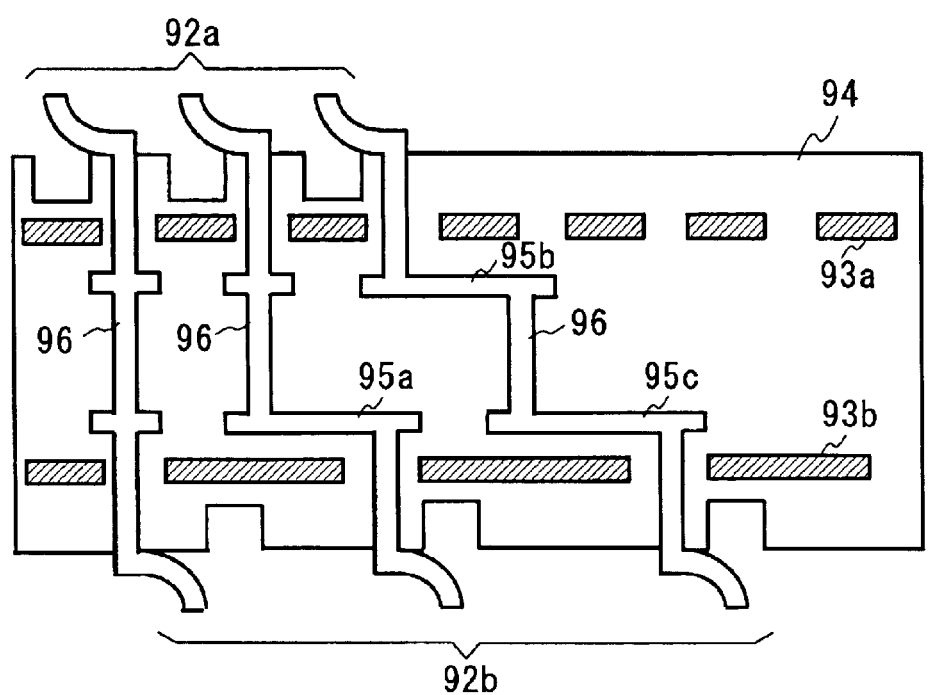
FIG. 26 shows a portion of a cross sectional view of a probe card 100 according to the fourteenth embodiment of the present invention.
Figure 27D:
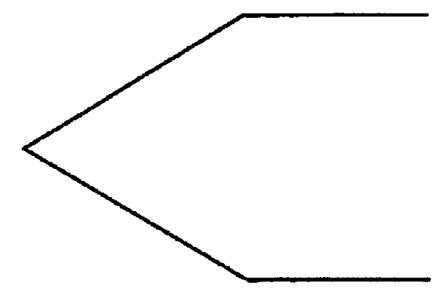
FIG. 27 shows examples of the shape of the end of the contactor 92.
Figure 27C:
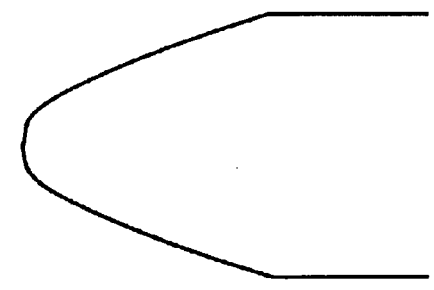
Figure 27B:
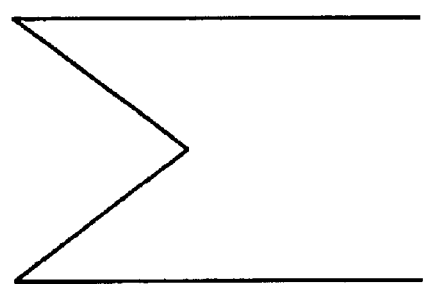
Figure 27A:
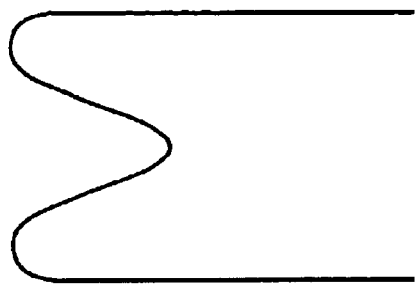

FIG. 26 shows a portion of a cross sectional view of a probe card 100 according to the fourteenth embodiment of the present invention. This probe card 100 includes a plurality of contactors 92a and 92b, grounding layers 93a and 93b, a substrate 94 and signal transmission paths 96. As the probe card 100 shows in FIG. 25, contactors 92a and 92b are formed on both sides of the substrate 94. The contactor 92a is disposed on one side of the substrate 94 to correspond to a pad of the circuit under test, and the contactor 92b is formed on the backside of the substrate 94 in place of the pad 84 shown in FIG. 9. The contactors 92a and 92b are electrically coupled to each other via the signal transmission path 96. The signal transmission path 96 includes internal transmitting units 95a, 95b and 95c elongated inparallel to the surface of the substrate 94 inside the substrate 94, and a penetrating-transmitting unit elongated in a direction of thickness of the substrate 94. The contactor 92b is made of a metallic glass as the contactor 92a. As the probe card 100 shows in FIG. 25, by forming the contactor 92b on the backside of the substrate 94, the probe card 100 of the fourteenth embodiment has elasticity on its backside as well as the other side on which the circuit under test is contacted.

The probe card 100 has multi-layered internal transmitting units 95a, 95b and 95c. According to FIG. 26, two layers of wiring lines are provided inside the substrate 94. The contactors 92a are located to correspond to the locations of pads of the circuit under test, and contactors 92b are located to correspond to pogo-pins 90 (see FIG. 9) disposed on the interface 74. Distances among pads of the circuit under test are extremely short, and pogo-pins are generally set to be spaced farther from others in comparison with the distances among the pads. Thus, according to the fourteenth embodiment, in order to electrically couple the contactors 92a and 92b, the signal transmission paths 96 have internal transmitting units 95a, 95b and 95c, which are elongated inparallel to the surface of the substrate 94, inside the substrate 94. Inside the substrate 94, the internal transmitting units 95a, 95b and 95c are preferably formed to bemulti-layered in a direction of thickness of the substrate 94. According to the probe card 100 shown in FIG. 26, the internal transmitting units 95a and 95c and the internal transmitting unit 95b are disposed at different distances from the surface of the substrate 94 inside the substrate 94. Although the signal transmission path 96 inside of the substrate 94 is shown in one dimension in FIG. 26, it is preferable to form the wiring layers in two dimensions, and the internal transmitting units on the wiring layers are extended in XY directions.

FIG. 27 shows examples of the shape of the end of the contactor 92. For example, the contactor 92 may be formed to have a sharp end which narrows towards the end, as shown in FIG. 27(a). Or, the contactor 92 may be formed to have a round end which also narrows towards the end, as shown in FIG. 27(b). Or, the contactor 92 may be formed to have a two-fingered fork shape end, where each of the fingers has a sharp end, as shown in FIG. 27(c). Or, the contactor 92 may be formed to have a two-fingered fork shape end, where each of the fingers has a round end, as shown in FIG. 27(d).

Now, with reference to FIGS. 28 to 34, there is described a method for forming a contactor, which is contacted to a contact terminal, on a substrate of a probe card for performing signal transmission between the circuit under test and the external semiconductor testing equipment by electrically coupling the contactors to a plurality of the contact terminals provided on the circuit under test. The method for forming a contactor includes a first step for forming a free unit by separating an end portion of an amorphous layer (metallic glass layer) from a substrate, and a second step for forming a contactor by bending the free unit. As described in detail below, FIGS. 28 and 29 show an embodiment of the first step of the method for forming a contactor, and FIGS. 30 to 34 show an embodiment of the second step of forming a contactor.

FIGS. 28(a) to 28(f) show cross sectional views of a probe card during processes of the first step of the method for forming a contactor according to the first embodiment of the present invention, wherein a free unit 128a of a metallic glass layer is formed by forming a cantilever 128 of an amorphous material (metallic glass). Referring to FIGS. 28(a) to 28(f), the first embodiment for forming the free unit 128a is described in detail, hereinafter.

Figure 28A:
FIG. 28 shows cross sectional views of a probe card during processes of the first step of the method for forming a contactor according to the first embodiment of the present invention.

First, as shown in FIG. 28(a), SiO$_2$ layer 120 is formed on a substrate 94 by a low temperature CVD method. Here, it is preferable to use a substrate 94 which is not deformed by heat and made of an insulating material. According to this embodiment, a substrate 94 made of Si is used.

Figure 28B:
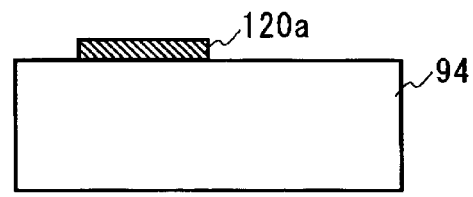

Then, as shown in FIG. 28(b), the SiO$_2$ layer 120 is partially etched by the photolithography process, and an SiO$_2$ sacrificial layer 120a is formed on a predetermined area of the substrate 94. Then, a polyimide is applied on the surface of the substrate 94 and the sacrificial layer 120a and hardened. Then, an aluminum layer ("Al layer") is deposited on the hardened polyimide layer, and a predetermined portion of the deposited Al layer is etched away according to a predetermined shape for a metallic glass layer 126a, which is formed later, by a photolithography process. The shape of the metallic glass layer 126a formed later is determined in this photolithography process. Then, the polyimide layer is dry-etched by using the remaining Al layer as a mask.

Figure 28C:
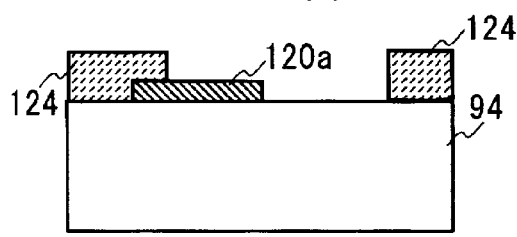

After dry-etching the polyimide layer, as shown in FIG. 28(c), the Al layer is wet-etched away, and the polyimide layer shaped according to the shape of the metallic glass layer 126a, which is formed later, is disclosed.

Figure 28E:
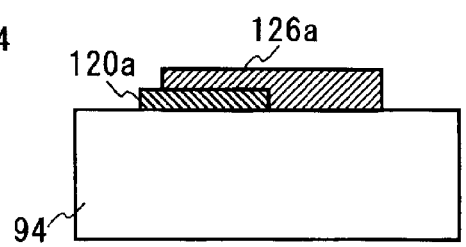
Figure 28D:
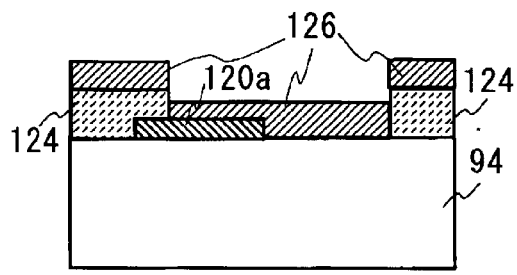

As shown in FIG. 28(d), the metallic glass layer 126 is now formed by sputtering a metallic glass material on the sacrificial layer 120a, the substrate 94 and the polyimide layer 124. According to this embodiment, ZrCuAl is used as the metallic glass material.

Then, as shown in FIG. 28(e), the polyimide layer 124 is etched away. On the substrate 94, the metallic glass layer 126a and the sacrificial layer 120a remain. The sacrificial layer 120a remains between a portion of the metallic glass layer 126a and the substrate 94.

FIG. 28(e') shows a plane view of the probe card shown in FIG. 28(e). According to the method for forming a contactor of the present invention, it is possible to form a plurality of minute metallic glass layers 126a simultaneously by using micromachining technology of a metallic glass material. According to FIG. 28(e'), there are shown three (3) metallic glass layers 126a formed on the sacrificial layer 120a and the substrate 94, as an example. As described above, since the shape of the metallic glass layer 126a is determined by that of the polyimide layer 124, according to the first embodiment, the metallic glass layer 126a has a sharp end shape shown in FIG. 27(a).

Figure 28F:
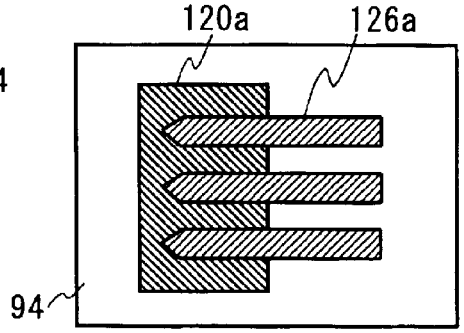
Figure 28F:
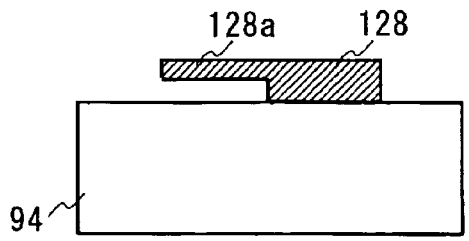

Then, as shown in FIG. 28(f), the sacrificial layer 120a is etched away, and a cantilever 128 of an amorphous material (metallic glass) is formed. By removing the sacrificial layer 120a, the metallic glass cantilever 128 includes a free unit 128a separated from the substrate 94.

As described above, according to the first step of the method for forming a contactor of the first embodiment of the present invention, it is possible to provide a method for forming a plurality of minute metallic glass cantilevers 128 by using a sacrificial layer 120a. Further, according to this embodiment, the metallic glass layer 126 is formed by sputtering, but it is of course possible to use other known methods like the PVD method including electron beam deposition, coating method or CVD method.

FIGS. 29(a) to 29(d) show cross sectional views of a probe card during processes of the first step of the method for forming a contactor according to the second embodiment of the present invention, wherein a free unit 128a of a metallic glass layer (metallic glass) 128a is formed by removing a portion of the substrate 94. Referring to FIGS. 29(a) to 29(d), the second embodiment of the first step for forming the free unit 128a is described in detail, hereinafter.

As shown in FIG. 29(a), a polyimide layer 160 is formed to have a predetermined shape for a metallic glass layer, which is formed later, on the substrate 94 by a photolithography process. The shape of the metallic glass layer 162a formed later is determined in this photolithography process.

Then, as shown in FIG. 29(b), the metallic glass layer 162 is formed by sputtering a metallic glass material on the substrate 94 and the polyimide layer 160. In this case, ZrCuAl is used as the metallic glass material.

Then, as shown in FIG. 29(c), the polyimide layer 160 is etched away. Therefore, the metallic glass layer 162a remains on the substrate 94. According to the method for forming a contactor of the present invention, it is possible to form a plurality of minute metallic glass layers 162a simultaneously by using micromachining technology of a metallic glass material.

FIG. 29(c') shows a plane view of the probe card shown in FIG. 29(c). According to FIG. 29(c'), there are shown three (3) metallic glass layers 162 a formed on the substrate 94, as an example. According to the second embodiment, the metallic glass layer 162a has a sharp end shape shown in FIG. 27(a), as in the first embodiment.

Then, as shown in FIG. 29(d), a predetermined portion of the substrate 94 under the metallic glass layer 162a is etched away, and a hole 102 is formed. As a result, a portion of the metallic glass layer 162a is separated from the substrate 94. To be concrete, the free unit 162a separated from the substrate 94 is formed by etching away a predetermined portion of the substrate 94 under the front end of the metallic glass 162a.

FIG. 29(d') shows a plane view of the probe card shown in FIG. 29(d). As shown in the drawing, one hole 102 is formed under the metallic glass layer 162a, but, according to another embodiment, holes are formed under each of the metallic glass layers 162a.

As described above with reference to FIGS. 29(a) to 29(d), according to the second embodiment of the first step for forming a contactor of the present invention, it is possible to provide a method for forming a free unit 128a by removing a predetermined portion of the substrate 94 under a front end of the metallic glass layer 162a. Further, according to this embodiment, the metallic glass layer 126 is formed by sputtering, but it is of course possible to use other known methods like the PVD method including electron beam deposition, coating method or CVD method.

FIGS. 30(a) to 30(e) show cross sectional views of a probe card during processes of the second step of the method for forming a contactor according to the first embodiment of the present invention, wherein the contactor is formed by bending the free unit 128a. Referring to FIGS. 30(a) to 30(e), the first embodiment of the second step for forming the contactor 92 by bending the free unit 128a is described in detail, hereinafter. In this embodiment, the free unit 128a formed according to the first embodiment of the first step shown in FIG. 28 is used.

Figure 30A:
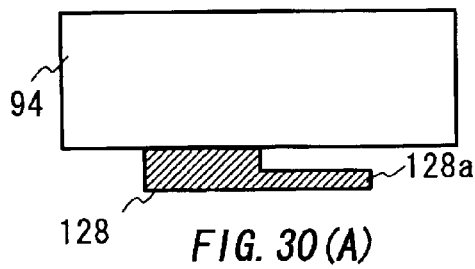
FIG. 30 shows cross sectional views of a probe card during processes of the second step of the method for forming a contactor according to the first embodiment of the present invention.

First, as shown in FIG. 30(a), the substrate 94 is reversed from the position shown in FIG. 28(f). In other words, the substrate 94 is disposed to make the free unit 128a toward the direction of gravity.

Figure 30B:
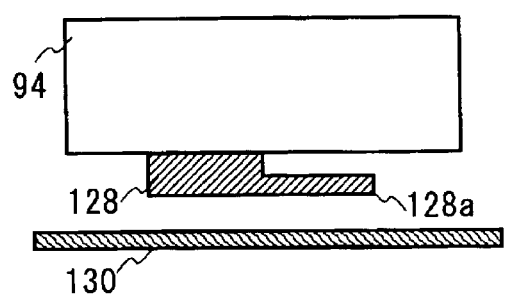

Then, as shown in FIG. 30(b), a bending adjustor 130 is provided at a predetermined location under the surface of the substrate 94. The bending adjustor 130 is preferably a substrate of rigidity, and, in this embodiment, a quartz glass substrate. By disposing the bending adjustor 130 at a predetermined position, it is possible to control the amount of bending of the free unit 128a when the free unit 128a is bent.

In order to determine the position of the bending adjustor 130, as shown in FIG. 30(b'), it is preferable to use a bending adjustor 130 having position determining units 132. The position determining unit 132 is used to determine the position of the bending adjustor 130 at a predetermined location under the surface of the substrate 94. The position determining unit 132 may preferably be a member of a predetermined length in the vertical direction from the surface of the bending adjustor 130. The length of the position determining unit 132 is determined based on the predetermined distance between the surfaces of the substrate 94 and the bending adjustor 130. By contacting the end of the position determining unit 132 on the substrate 94, it is easy to dispose the bending adjustor 130 at a predetermined position under the substrate 94.

The bending adjustor 130 is preferably made of a material of higher transmittance for infrared light than that of the substrate 94. Further, the bending adjustor 130 is made of a material having high rigidity and flatness less than +/-10 um in order to form contactors 92 of uniform amount of bending. The flatness of the bending adjustor 130 is preferable to be less than +/-5 um, and further preferable if less than +/-2 um.

Figure 30C:
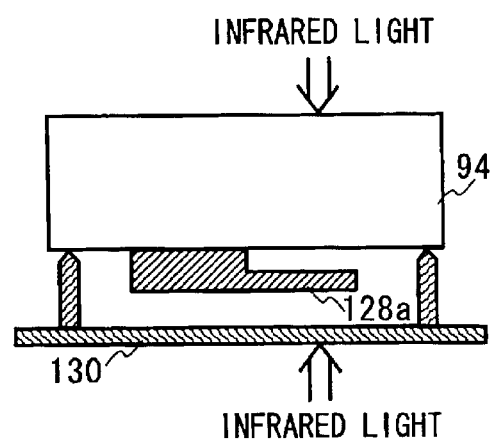

Then, as shown in FIG. 30(c), infrared light is irradiated on the free unit 128a. Here, the infrared light is irradiated through the Si substrate 94 and quartz glass bending adjustor 130. The bending adjustor 130 is preferably made of material which is not deformed by heat when the infrared light is irradiated. Since the free unit 128a is heated within a very short time period, it is preferable to irradiate both sides of the substrate. As described above with reference to FIG. 11(b), the grounding conductor 98 made of metal is not provided on areas corresponding to the locations of free units 128 on the backside of the surface of the substrate 94 where the metal cantilevers 128 are formed. Since the infrared light can not pass through metal, it is impossible to irradiate the infrared light on the free unit 128 from the backside of the substrate 94 if the grounding conductor 98 is provided on the whole surface of the backside of the substrate 94. Therefore, according to the embodiment shown in FIG. 11(b), since the grounding conductor 98 is not provided on areas of the backside of the substrate 94 corresponding to the locations of free units 128, it is possible to irradiate the infrared light from both sides of the substrate 94.

The metallic glass has characteristics of being amorphous, high yield strength, high breaking tenacity, high corrosion-resistance and high hardness. Further, the metallic glass also has characteristics of plastic deformation and less viscosity at a higher temperature. According to the present embodiment, ZrCuAl of Zr series is used as the metallic glass, and it is possible to use other metallic glasses, such as Pd series or Ti series metallic glasses in another embodiments.

Figure 30D:
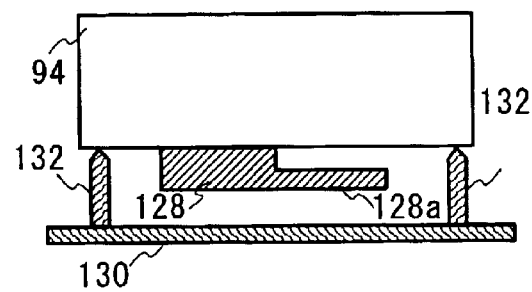
Figure 30D:
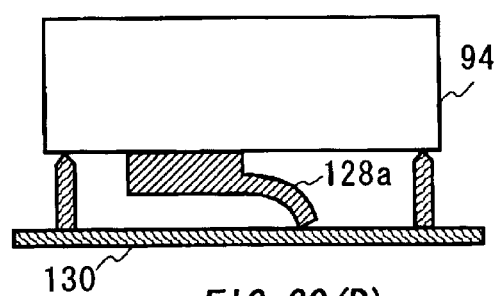

The free unit 128a made of ZrCuAl is in an amorphous state, and viscosity of it is changed according to temperature. To be concrete, if the free unit 128a is heated in a supercooled liquid phase region, it shows viscous fluidity. Therefore, by heating the free unit 128a through irradiating infrared light on the whole free unit 128a from both sides of the substrate 94, the whole free unit 128a shows plastic deformation as shown in FIG. 30(d). In this case, the free unit 128a is bent downward apart from the substrate 94 due to gravity.

After the end of the whole free unit 128a is contacted to the bending adjustor 130, irradiation of the infrared light is stopped. Since the free unit 128a is made of a metallic glass material showing viscous fluidity in a supercooled liquid phase region, remaining internal stress inside the bent free unit 128a is almost zero (0). Temperature of the free unit 128a is gradually decreased, but the remaining internal stress of the free unit 128a remains almost zero (0). Therefore, as the temperature of the free unit 128a is decreased, the free unit 128a is not deformed and maintains its shape when the irradiation of infrared light is stopped.

Figure 30E:
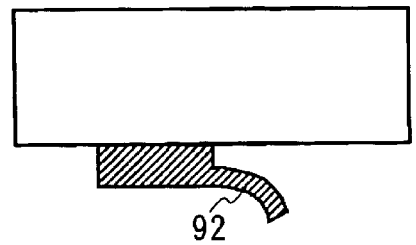
Figure 31:
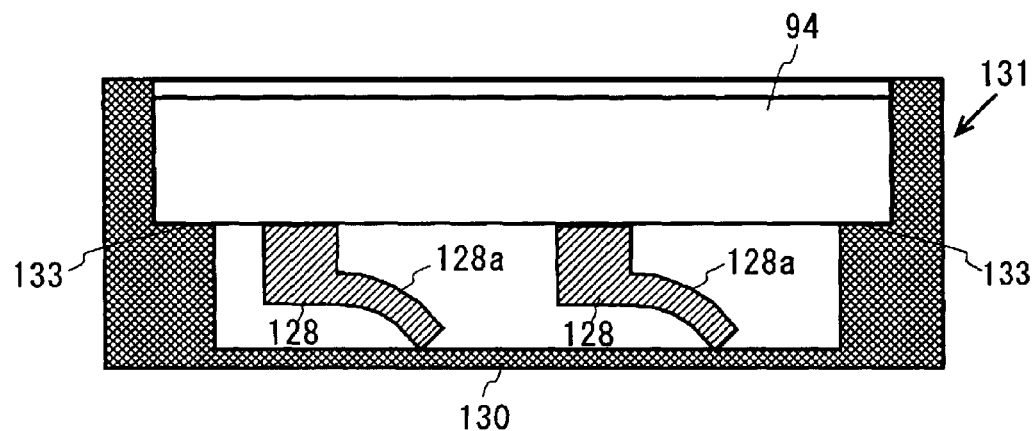
FIG. 31 shows another embodiment of the bending adjustor 130 and the position determining unit 132 shown in FIG. 30.
Figure 31:
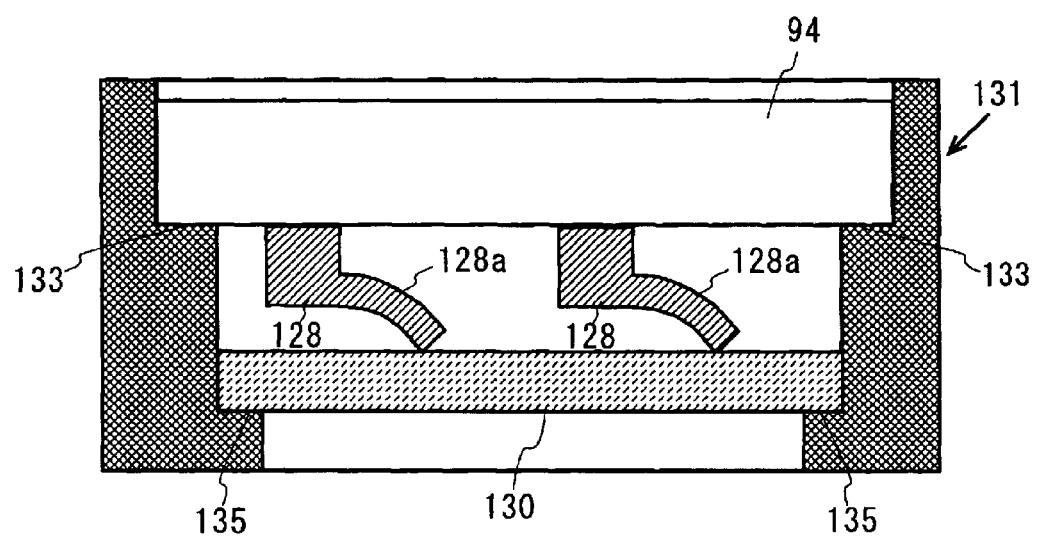

Then, as shown in FIG. 30(e), the bending adjustor 130 is removed, and a contactor 92 with a desired amount of bending is formed.

Figure 1:
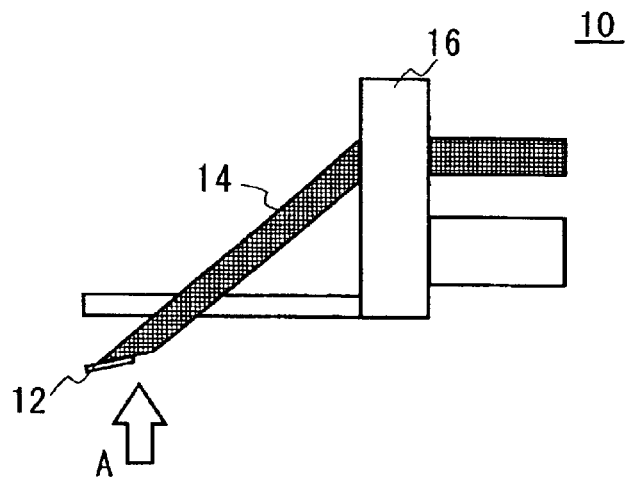
FIG. 1 shows a schematic diagram of a conventional contacting unit 10 through which a high frequency test signal can be transmitted between semiconductor testing equipment and a circuit under test, which is being tested.
Figure 2:
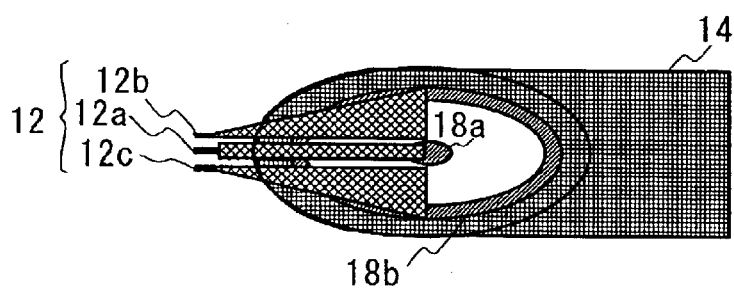
FIG. 2 shows a diagram of a portion of the contacting unit 10 near the contactor 12 in the direction of arrow A of FIG. 1.
Figure 3:
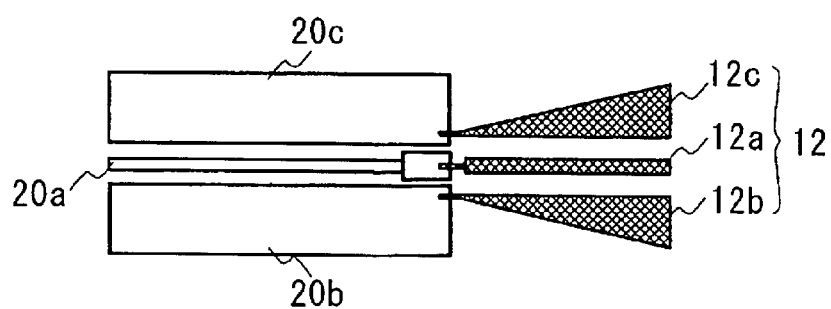
FIG. 3 shows the contactor 12 contacted to the circuit under test.
Figure 4:
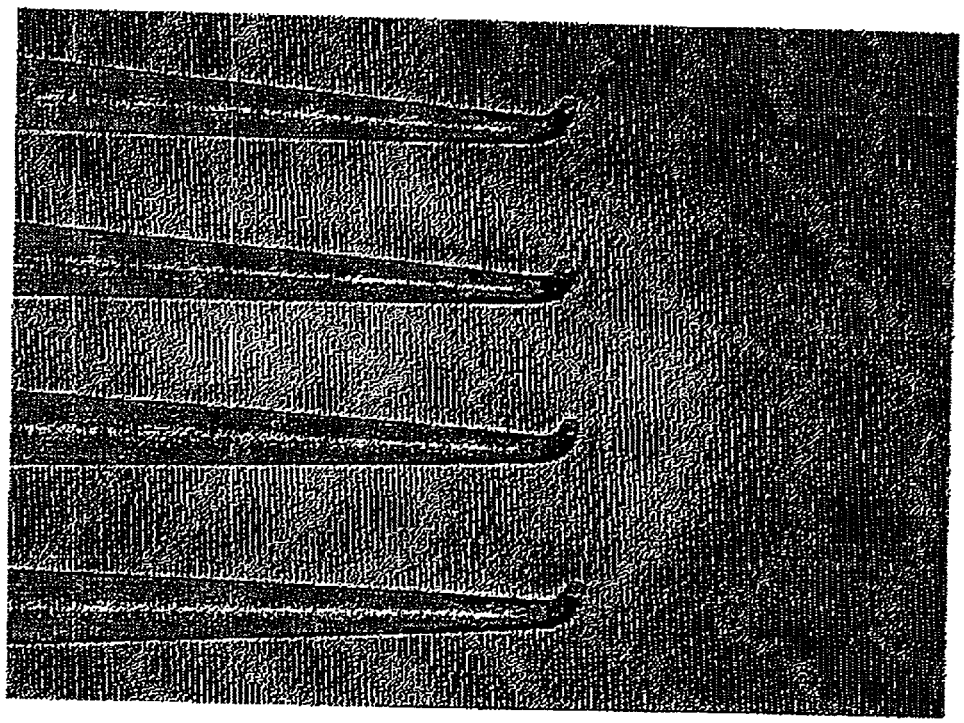
FIG. 4 shows conventional probe pins of horizontal needle probe type.
Figure 5:
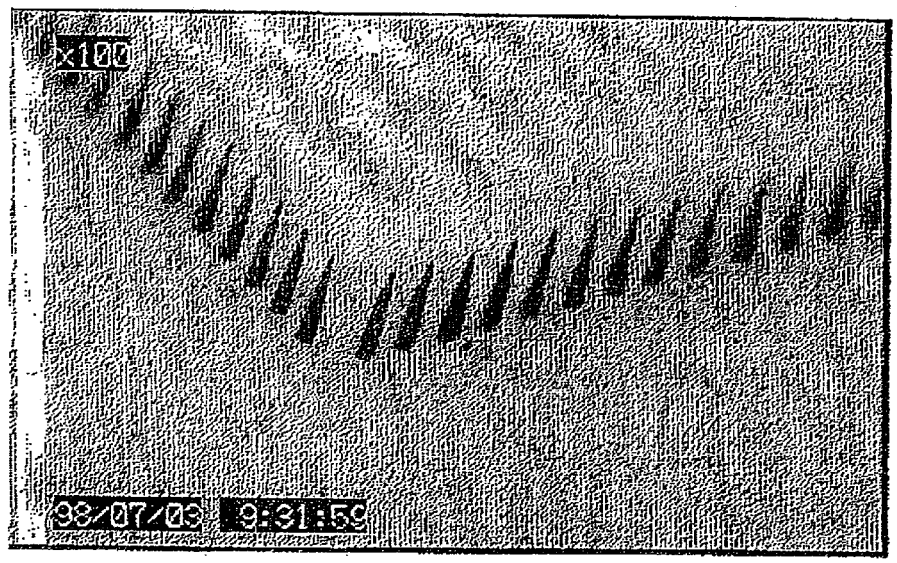
FIG. 5 shows another conventional probe pin of vertical needle probe type.
Figure 6:
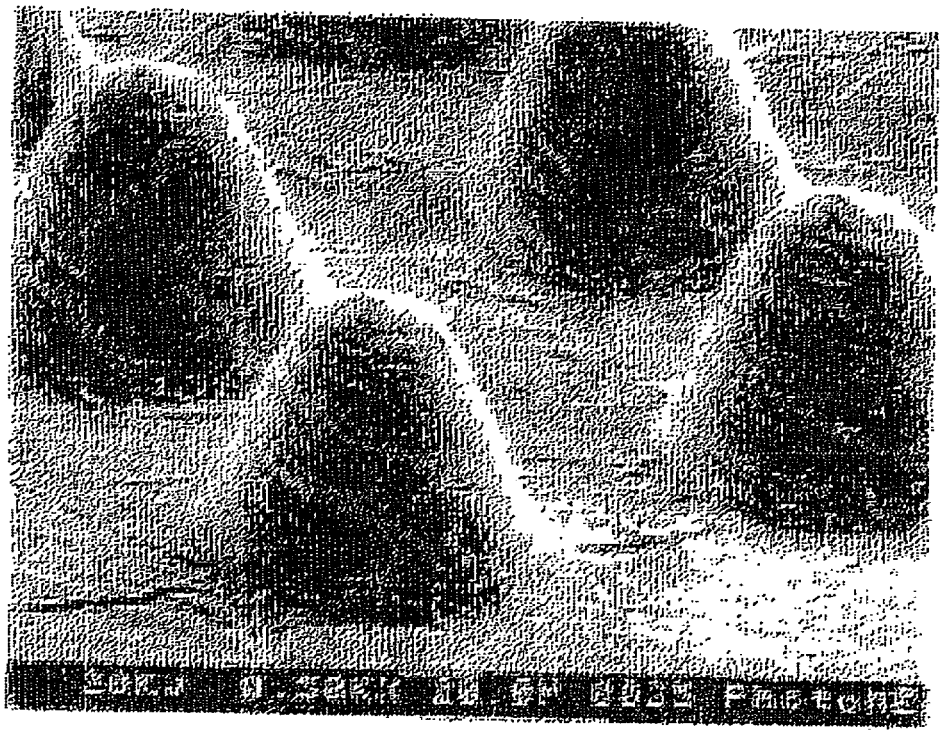
FIG. 6 shows conventional probe pins made by the membrane method.
Figure 7:
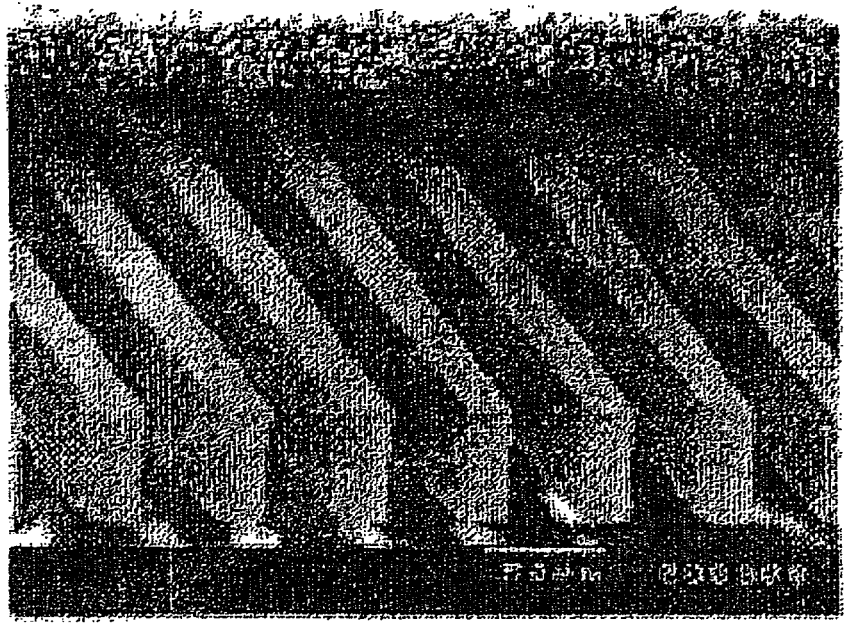
FIG. 7 shows conventional probe pins made through photolithography plating.

As described above with reference to FIG. 4, the metal needle made of W, ReW, BeCu or Pd has crystalline grains. According to these types of metal needles, scrapes generated through scrubbing with the pad enters into the crystalline grains of the needle made of this kind of material after repeated contact with the pad of the circuit under test, and, as a result, contact resistance is increased. In contrast, the metallic glass of the present invention does not have crystalline grains. Therefore, the contactor 92 made of the metallic glass material has excellent contact characteristics compared to the conventional metal needles.

According to the above described embodiment of the present invention with reference to FIGS. 28 to 30, first, the metallic glass cantilever 128 is formed from metallic glass material, and then the contactor 92 is formed by bending the free unit 128a of the metallic glass cantilever 128.

Further, according to the embodiment described above with reference to FIG. 30, the contactor 92 is formed by using the free unit 128a shown in FIG. 28, it is also possible to bend the free unit 128a shown in FIG. 29 by the method described above with reference to FIG. 30. In other words, it is possible to form the contactor 92 by irradiating infrared light on the free unit 128a shown in FIG. 29 and deforming the free unit 128a. By bending the free unit 128a shown in FIG. 29, it is possible to form the contactor 92 shown in FIG. 10, for example.

FIG. 31(a) shows another embodiment of the bending adjustor 130 and the position determining unit 132 shown in FIG. 30. According to FIG. 31(a), a bending adjusting member 131 includes a bending adjustor 130 and an engaging unit 133. The engaging unit 133 suppresses movement of the substrate 94 in the direction of gravity. As shown in the drawing, the bending adjusting member 131 includes a recess having the engaging unit 133. According to this embodiment, although the engaging unit 133 is formed by providing a stair on the inside wall of the bending adjusting member 131, it is also possible to form a protrusion on the inside wall of the bending adjusting member 131. The inside wall of the bending adjusting member 131 over the engaging unit 133 is formed according to the shape of the substrate 94. At least a portion of the inside wall of the upper portion of the bending adjusting member 131 is preferably contacted to the side wall of the substrate 94 in order to suppress movement of the substrate 94 in the horizontal direction.

The lower portion of the bending adjusting member 131 functions as the bending adjustor 130 as shown in FIG. 30. Therefore, as in the case of FIG. 30, at least the lower portion (or, bending adjustor 130) of the bending adjusting member 131 is preferably made of a material of high transmittance for infrared light. Bending amount of the free unit 128a is determined by the distance between the bending adjustor 130 and the engaging unit 133. In other words, the engaging unit 130 performs the same function of the position determining unit 132 shown in FIG. 30. In order to achieve the strong requirement of the flatness, it is preferable to make the bending adjusting member 131 with quartz.

FIG. 31(b) shows another embodiment of the bending adjusting member 131 shown in FIG. 31(a). The bending adjusting member 131 includes a first engaging unit 133, a second engaging unit 135 and a bending adjustor 130. According to this embodiment, although the first and second engaging units 133 and 135 are formed by providing stairs on the inside wall of the bending adjusting member 131, it is also possible to form protrusions on the inside wall of the bending adjusting member 131. The first engaging unit 133 suppresses movement of the substrate 94 in the direction of gravity. Further, the bending adjustor 130 is disposed on the second engaging unit 135, and the second engaging unit 135 suppresses movement of the bending adjustor 130 in the direction of gravity. Further, it is preferable to suppress horizontal movement of the bending adjustor 130 by using the inside wall of the recess of the bending adjusting member 131 between the second and first engaging units 135 and 133.

The length of the free unit 128a is determined by the distance between the bending adjustor 130 and the first engaging unit 133. Therefore, according to the bending adjusting member 131 of this embodiment, it is possible to control the bending amount of the free unit 128a by changing the thickness of the bending adjustor 130. For example, it is possible to control the bending amount of the free unit 128a by properly changing the bending adjustor 130 disposed on the second engaging unit 135 with a plurality of bending adjustors 130 of different thickness according to the desired amount of bending.

Although the method for bending the free unit 128a by using gravity with reference to FIG. 30 is described, it is also possible to use centrifugal force, electric field or magnetic field to bend the free unit 128a. Further, it is also possible to bend the free unit 128a by forming the free unit 128a as a bimorph structure.

Figure 32:
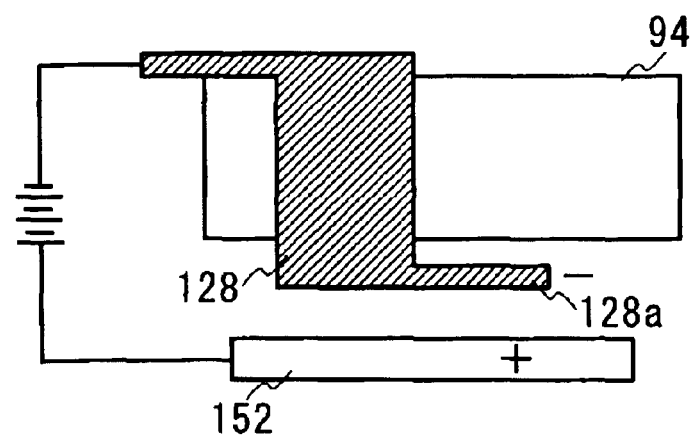
FIG. 32 shows a diagram of an embodiment for bending the free unit 128a by using an electric field.

FIG. 32 shows a diagram of an embodiment for bending the free unit 128a by using an electric field. An electrode 152 is provided under the free unit 128a. In order to bend all of the free units 128a formed on the whole surface of the substrate 94, it is preferable to make the electrode 152 as large as the whole surface of the substrate 94. Then, by applying voltage source to the electrode 152, the free unit 128a is set to a negative voltage and the electrode 152 to a positive voltage. It is also preferable to set the free unit 128a to a positive voltage and the electrode to a negative voltage. By applying an electric field between the free unit 128a and the electrode 152, the free unit 128a is bent toward the electrode 152. Since the free unit 128a is made of a metallic glass material having viscous fluidity in a supercooled liquid phase region, the free unit 128a maintains its shape even when the voltage source is off. According to this embodiment, it is possible to form contactors simultaneously by using an electric field.

Figure 33A:
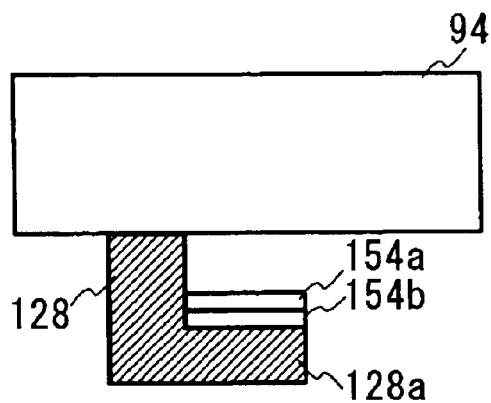
FIG. 33 shows diagrams of an embodiment for bending the free unit 128a formed in a bimorph structure.
Figure 33B:
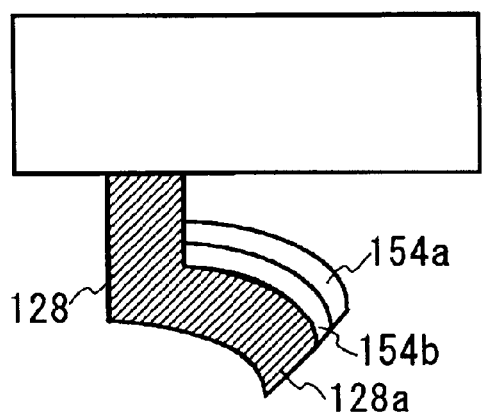
Figure 33C:
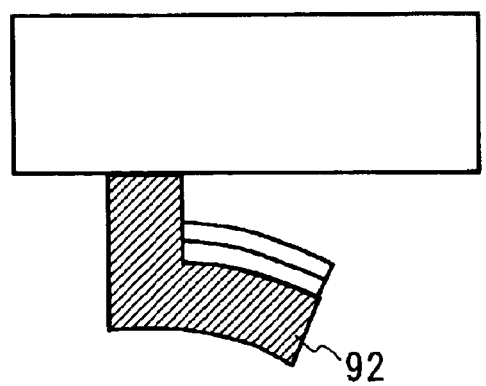

FIGS. 33(a) to 33(c) show diagrams of an embodiment for bending the free unit 128a formed in a bimorph structure. As shown in FIG. 33(a), the metallic glass cantilever 128 includes piezoelectric members 154a and 154b. The piezoelectric members 154a and 154b are formed to be extended or shortened in a direction of length of the metallic glass cantilever when a voltage is applied to them. A voltage to extend the piezoelectric member 154a is applied to the piezoelectric member 154a from the state shown in FIG. 33(a). At the same time, another voltage to shorten the piezoelectric member 154b is applied to the piezoelectric member 154b.

Since the piezoelectric member 154a is extended and the piezoelectric member 154b is shortened, the free unit 128a is bent downward as shown in FIG. 33(b). Here, it is preferable to heat the free unit 128a. Under the state where the free unit 128a is bent downward, heating the free unit 128a is stopped. The free unit 128a becomes stiff as it is bent when it is cooled. Then, application of voltages to the piezoelectric members 154a and 154b is stopped. At this moment, the piezoelectric members 154a and 154b are to return to the original states, but since the metallic glass of the free unit 128a became stiff when bent, the piezoelectric members 154a and 154b can not return to their original state, and are in a stable state which is between the original state and the most bent state.

FIG. 33(c) shows a contactor 92 generated in a stable state which is between the original state and most bent state. According to this embodiment, by forming the free unit 128a as a bimorph structure, it is possible to form contactors simultaneously. According to FIG. 33, the piezoelectric members 154a and 154b are formed to be adjacent to each other, but, according to another embodiment, it is also preferable to form the piezoelectric members 154a and 154b on both sides of the free unit 128a in order for the piezoelectric members 154a and 154b to sandwich the free unit 128a. Further, after forming the contactor 92 by bending the free unit 128a, it is also possible to remove the piezoelectric members 154a and 154b by, for example, etching.

According to FIG. 33, the method for bending the free unit 128a by using two (2) piezoelectric members 154a and 154b is described, but it is also possible to bend the free unit 128a by using one (1) piezoelectric member.

Figure 34:
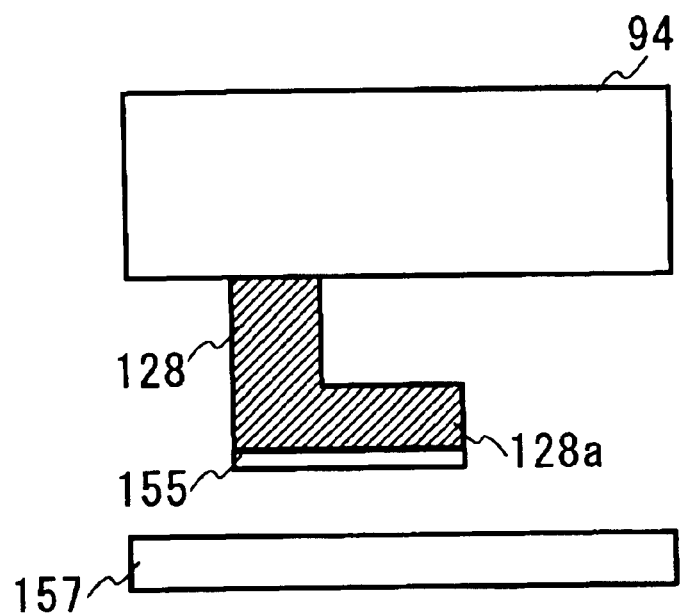
FIG. 34 shows a diagram of an embodiment for bending the free unit 128a by using a magnetic field.

FIG. 34 shows a diagram of an embodiment for bending the free unit 128a by using a magnetic field. According to this embodiment, a magnetic layer 155 having magnetism is formed on the surface of the free unit 128a. Apart from the magnetic layer 155, a magnet 157 is disposed. Distance between the magnetic layer 155 and the magnet 157 is determined by the amount of bending of the free unit 128a. When the free unit 128a is heated to a temperature where it shows viscous fluidity, the magnetic layer 155 and the free unit 128a are bent toward the magnet 157. At this moment, it is preferable to form the magnetic layer 155 to be thin on the surface of the free unit 128a in order for the free unit 128a to be easily bent. When the magnetic layer 155 is contacted to the magnet 157, heating of the free unit 128a is stopped. Then, the magnetic layer 155 is removed by etching, and the contactor 92 of a predetermined amount of bending is formed.

Referring to FIGS. 30 to 34, embodiments of the second step of a method for forming a contactor are described, but it is also possible to bend the free unit 128a by another method. For example, the free unit 128a is heated to the supercooled liquid phase region, and then, it is also possible to bend the free unit 128a by a mechanical force.

Figure 35:
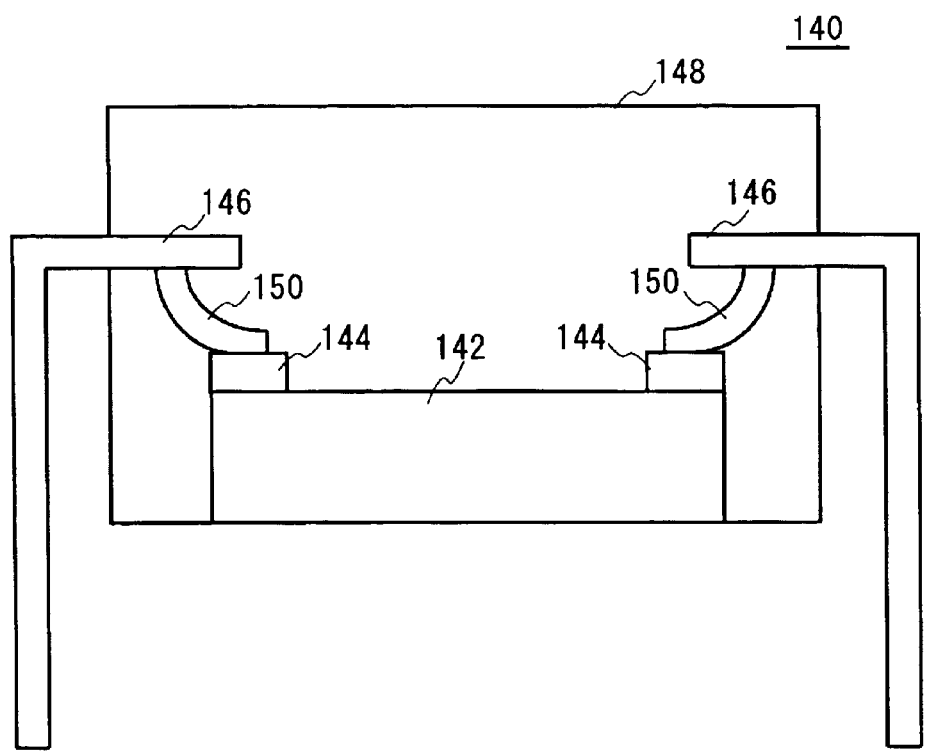
FIG. 35 shows a cross sectional view of a semiconductor device 140, wherein pads are contacted to electrode leads by using contactors of the present invention.

FIG. 35 shows a cross sectional view of a semiconductor device 140, wherein pads are contacted to electrode leads using contactors of the present invention. The semiconductor device 140 includes a semiconductor chip 142, electrode leads 146 and a package 148. The package 148 packs the semiconductor chip. The semiconductor chip 142 includes a plurality of pads 144, and the plurality of pads 144 are contacted to contactors 150.

Conventionally, the pads 144 and the electrode leads 146 are contacted through wire bonding. As shown in FIG. 35, according to the semiconductor device 140, it is possible to contact the pads 144 and the electrode leads 146 through contactors 150 made of a metallic glass material. The contactors 150 correspond to the contactors 92 described with reference to FIGS. 9 to 34, and the details of the contactors 150 are omitted. Since the contactors 150 can be formed by micromachining, it is possible to easily form the contactors 150 on the pads 144 of narrow pitches.

Further, the contactors 150 have elasticity in a direction away from the pads 144. Therefore, the contactors 150 are contacted to the electrode leads 146 with pressure, and reliable contact can be achieved between the contactors 150 and the electrode leads 146.

Figure 36:
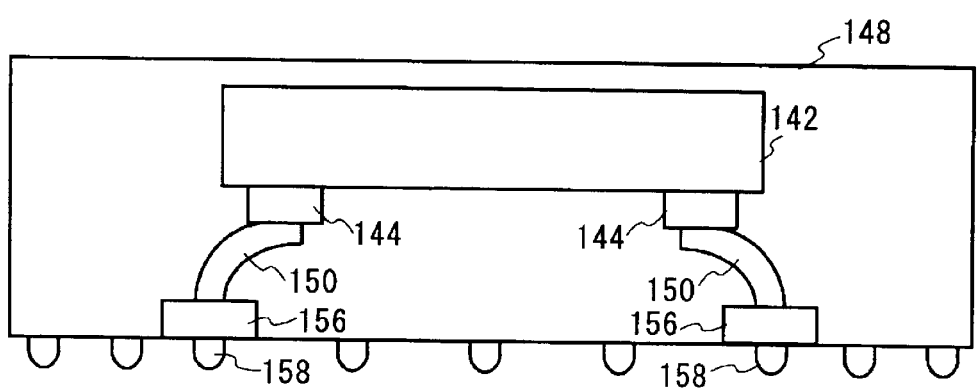
FIG. 36 shows a cross sectional view of a semiconductor device 140, wherein pads are contacted to external terminal balls by using contactors of the present invention.

FIG. 36 shows a cross sectional view of a semiconductor device 140, wherein pads are contacted to external terminal balls by using contactors of the present invention. The semiconductor device 140 includes a semiconductor chip 142, external terminal balls 158 and a package 148. The package 148 packs the semiconductor chip 142. The semiconductor chip 142 includes a plurality of pads 144, and the plurality of pads 144 are contacted to contactors 150.

The contactors 150 correspond to the contactors 92 described with reference to FIGS. 9 to 34, and the details of the contactors 150 are omitted. Since the contactors 150 can be formed by micromachining, it is possible to easily form the contactors 150 on the pads 144 of narrow pitches. The contactors 150 are contacted to the pads 156. The pads 156 are electrically contacted to the corresponding external terminal balls 158. The semiconductor chip 142 can be attached to the package 148 by glue or fixed to the package 148 by injecting resin. Further, according to FIG. 35, the contactors 150 are formed on the pads 144, but it is also possible to form the contactors 150 on the pads 156 and make them contact to the pads 144.

According to the present invention, it is possible to provide a probe card which can transmit high frequency signals to an integrated circuit having a plurality of pads on an area of a narrow pitch.

As apparent from the above description, according to the present invention, it is possible to provide a probe card including a contactor made of a metallic glass and a method for manufacturing thereof. Although preferred embodiments of the present invention are described in detail, the technical scope of the present invention is not limited by the described embodiments. It is apparent to one skilled in the art to change or modify the described embodiments. According to the claims, it is apparent that the various modifications or changes are also within the technical scope of the present invention.

What is claimed is:

1. A probe card electrically coupled to a contact terminal provided on a circuit under test for performing signal transmission between said circuit under test and an external semiconductor testing device, comprising:

a substrate;

a signal transmission path formed on said substrate; and a contactor formed on an end of said signal transmission path on one side of said substrate, wherein said contactor is made of an amorphous material comprising a supercooled liquid phase region and contacted to said contact terminal provided on said circuit under test.

2. A probe card as claimed in claim 1, wherein said contactor is formed to be separated from said substrate.

3. A probe card as claimed in claim 1, wherein said contactor is extended to a predetermined direction from a surface of said substrate.

4. A probe card as claimed in claim 1, wherein said contactor has a vertical elasticity against a surface of said substrate.

5. A probe card as claimed in claim 1, wherein at least a portion of said signal transmission path near said end of it is made of the same amorphous material used for said contactor.

6. A probe card as claimed in claim 1 further comprising a grounding line, which is grounded, formed to be apart from and in parallel to said signal transmission path.

7. A probe card as claimed in claim 1 further comprising a voltage providing unit for providing a predetermined voltage, said voltage providing unit being provided on a backside of said one side of said substrate.

8. A probe card as claimed in claim 7, wherein said voltage providing unit is formed on an area other than areas of said backside of said substrate corresponding to areas of said one side of said substrate where said contactor is formed.

* * * * *

UNITED STATES PATENT AND TRADEMARK OFFICE
CERTIFICATE OF CORRECTION

PATENT NO. : 6,809,539 B2
DATED : October 26, 2004
INVENTOR(S) : Koichi Wada et al.

It is certified that error appears in the above-identified patent and that said Letters Patent is hereby corrected as shown below:

Title page,
Item [75], Inventors, please insert -- Yasuhiro Maeda -- as the third inventor.
Item [56], References Cited, OTHER PUBLICATIONS,
"Donald L. Smith et al.," reference, please insert -- Bonding -- after "Flip-Chip".

Signed and Sealed this

Twenty-second Day of February, 2005

JON W. DUDAS
*Director of the United States Patent and Trademark Office*